US012628330B2

(12) United States Patent
Ahn et al.

(10) Patent No.: US 12,628,330 B2
(45) Date of Patent: May 12, 2026

(54) SEMICONDUCTOR DEVICE

(71) Applicant: SAMSUNG ELECTRONICS CO., LTD., Suwon-si (KR)

(72) Inventors: Junhyeok Ahn, Suwon-si (KR); Hyosub Kim, Seoul (KR); Sohyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 735 days.

(21) Appl. No.: 18/072,885

(22) Filed: Dec. 1, 2022

(65) Prior Publication Data

US 2023/0247822 A1      Aug. 3, 2023

(30) Foreign Application Priority Data

Jan. 20, 2022      (KR) ........................ 10-2022-0008690

(51) Int. Cl.
 *H01L 23/48* (2006.01)
 *H10B 12/00* (2023.01)
(52) U.S. Cl.
 CPC ................................... *H10B 12/30* (2023.02)
(58) Field of Classification Search
 CPC .... H10D 64/518; H10D 64/01; H10D 64/513; H10D 64/514; H10D 30/60; H10D 64/027; H10D 64/66; H10D 64/512; H10D 84/0135; H10D 84/0151; H10B 12/053; H10B 12/315; H10B 12/34; H10B 12/0335; H01L 21/28026
 See application file for complete search history.

(56) References Cited

U.S. PATENT DOCUMENTS 4,974,055 A * 11/1990 Haskell ............. H01L 21/28525
                                                    257/E21.507
7,611,956 B2   11/2009 Kim et al.
8,048,737 B2   11/2011 Kim et al.
              (Continued)

FOREIGN PATENT DOCUMENTS

CN          105374820       3/2016
KR    10-2009-0034171 A      4/2009
              (Continued)

OTHER PUBLICATIONS

Office Action issued in corresponding TW Patent Application No. 112101921 on Dec. 12, 2023.

(Continued)

*Primary Examiner* — Samuel Park
(74) *Attorney, Agent, or Firm* — Morgan, Lewis & Bockius LLP

(57) ABSTRACT

A semiconductor device includes a substrate having an active area and a non-active area. An extra pad layer is disposed on the active area of the substrate. A first contact layer is disposed in a contact hole defined inside the substrate from a surface of the extra pad layer. A first silicide layer is disposed on both sidewalls of the first contact layer. A buried insulating layer is buried in the contact hole at lateral sides of the first contact layer and the first silicide layer. A second silicide layer is disposed on an upper surface and sidewalls of the extra pad layer. A second contact layer is on the buried insulating layer and the second silicide layer and is in direct contact with the second silicide layer.

20 Claims, 19 Drawing Sheets

(56)  References Cited

U.S. PATENT DOCUMENTS

| 8,148,260 B2 | 4/2012 | Shin |
|---|---|---|
| 9,024,371 B2 | 5/2015 | Lee et al. |
| 9,214,382 B2 | 12/2015 | Lee et al. |
| 9,368,356 B2 | 6/2016 | Kim |
| 9,601,588 B2 | 3/2017 | Kim |
| 9,640,426 B2 | 5/2017 | Rho et al. |
| 10,672,773 B2 | 6/2020 | Ji et al. |
| 11,037,930 B2 | 6/2021 | Park et al. |
| 2014/0110851 A1* | 4/2014 | Kim ........................ H01L 23/48 257/773 |
| 2015/0364334 A1* | 12/2015 | Kang ................ H01L 21/76816 438/703 |
| 2015/0380508 A1* | 12/2015 | Kim .................... H10B 12/482 257/773 |
| 2018/0211961 A1 | 7/2018 | Lin et al. |
| 2018/0331197 A1* | 11/2018 | Yamamoto ......... H10D 30/6715 |
| 2019/0131307 A1* | 5/2019 | Kim .................... H10B 12/053 |
| 2019/0131421 A1* | 5/2019 | Shen ...................... H10D 62/83 |
| 2020/0343350 A1* | 10/2020 | Lee .................... H10D 30/6735 |
| 2020/0365537 A1* | 11/2020 | Choi ................... H10B 12/315 |
| 2021/0057339 A1 | 2/2021 | Lee et al. |
| 2021/0098583 A1* | 4/2021 | Tsai .................... H10D 62/121 |
| 2023/0260905 A1* | 8/2023 | Fang .................. H01L 23/5283 257/734 |

FOREIGN PATENT DOCUMENTS

| KR | 10-2015-0027363 A | 3/2015 |
|---|---|---|
| KR | 10-2019-0112443 A | 10/2019 |

OTHER PUBLICATIONS

Office Action of Korean Patent Office in Application No. 10-2022-0008690, dated Jul. 14, 2025.

* cited by examiner

SEMICONDUCTOR DEVICE

CROSS-REFERENCE TO RELATED APPLICATION

This application claims priority under 35 U.S.C, § 119 to Korean Patent Application No. 10-2022-0008690, filed on Jan. 20, 2022 in the Korean Intellectual Property Office, the disclosure of which is incorporated by reference in its entirety herein.

1. TECHNICAL FIELD

The present inventive concept relates to a semiconductor device, and more particularly, to a semiconductor device capable of increasing resistance characteristics and increasing integration.

2. DISCUSSION OF RELATED ART

As semiconductor devices are increasingly downscaled, the size of a circuit pattern for the semiconductor device is further reduced. In addition, as the integration level of semiconductor devices has increased, the line width of a conductive line, for example, a bit line, has decreased.

Accordingly, the difficulty of a process of forming a contact between conductive lines has increased, and it is becoming more difficult to increase resistance characteristics and the integration level of the semiconductor device.

SUMMARY

The present inventive concept provides a semiconductor device capable of increasing resistance characteristics and the integration level of the semiconductor device.

According to an embodiment of the present inventive concept, a semiconductor device includes a substrate having an active area and a non-active area. An extra pad layer is disposed on the active area of the substrate. A first contact layer is disposed in a contact hole defined inside the substrate from a surface of the extra pad layer. A first silicide layer is disposed on both sidewalk of the first contact layer. A buried insulating layer is buried in the contact hole at lateral sides of the first contact layer and the first silicide layer. A second silicide layer is disposed on an upper surface and sidewalk of the extra pad layer. A second contact layer is on the buried insulating layer and the second silicide layer and is in direct contact with the second silicide layer.

According to an embodiment of the present inventive concept, a semiconductor device includes a substrate having an active area and a non-active area. An extra pad layer is disposed on the active area of the substrate. A first contact silicide layer is disposed in a contact hole defined inside the substrate from a surface of the extra pad layer. A buried insulating layer is buried in the contact holes on lateral sides of the first contact silicide layer. A second silicide layer is disposed on an upper surface and sidewalls of the extra pad layer. A second contact layer is on the buried insulating layer and the second silicide layer and in direct contact with the second silicide layer.

According to an embodiment of the present inventive concept, a semiconductor device includes a substrate having an active area and a non-active area. An extra pad layer is disposed on the active area of the substrate. A pad isolation insulating layer is disposed on the non-active area of the substrate and insulating the extra pad layer. A first contact layer is disposed in a contact hole defined inside the substrate from a surface of the extra pad layer, A first silicide layer is disposed on both sidewalls of the first contact layer. A first conductive layer is disposed on the first contact layer and the first silicide layer. A buried insulating layer is buried in the contact hole at lateral sides of the first contact layer and the first silicide layer. A second silicide layer is disposed on an upper surface and sidewalls of the extra pad layer. A second contact layer is on the buried insulating layer and the second silicide layer and in direct contact with the second silicide layer. A second conductive layer is disposed on the pad isolation insulating layer and insulated from the second contact layer.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Hereinafter, embodiments of the present inventive concept will be described in detail with reference to the accompanying drawings. The following embodiments of the present inventive concept may be implemented as one embodiment, and in addition, the following embodiments may be implemented by combining one or more features. Therefore, embodiments of the present inventive concept are not limited to any one embodiment.

Figure 1:
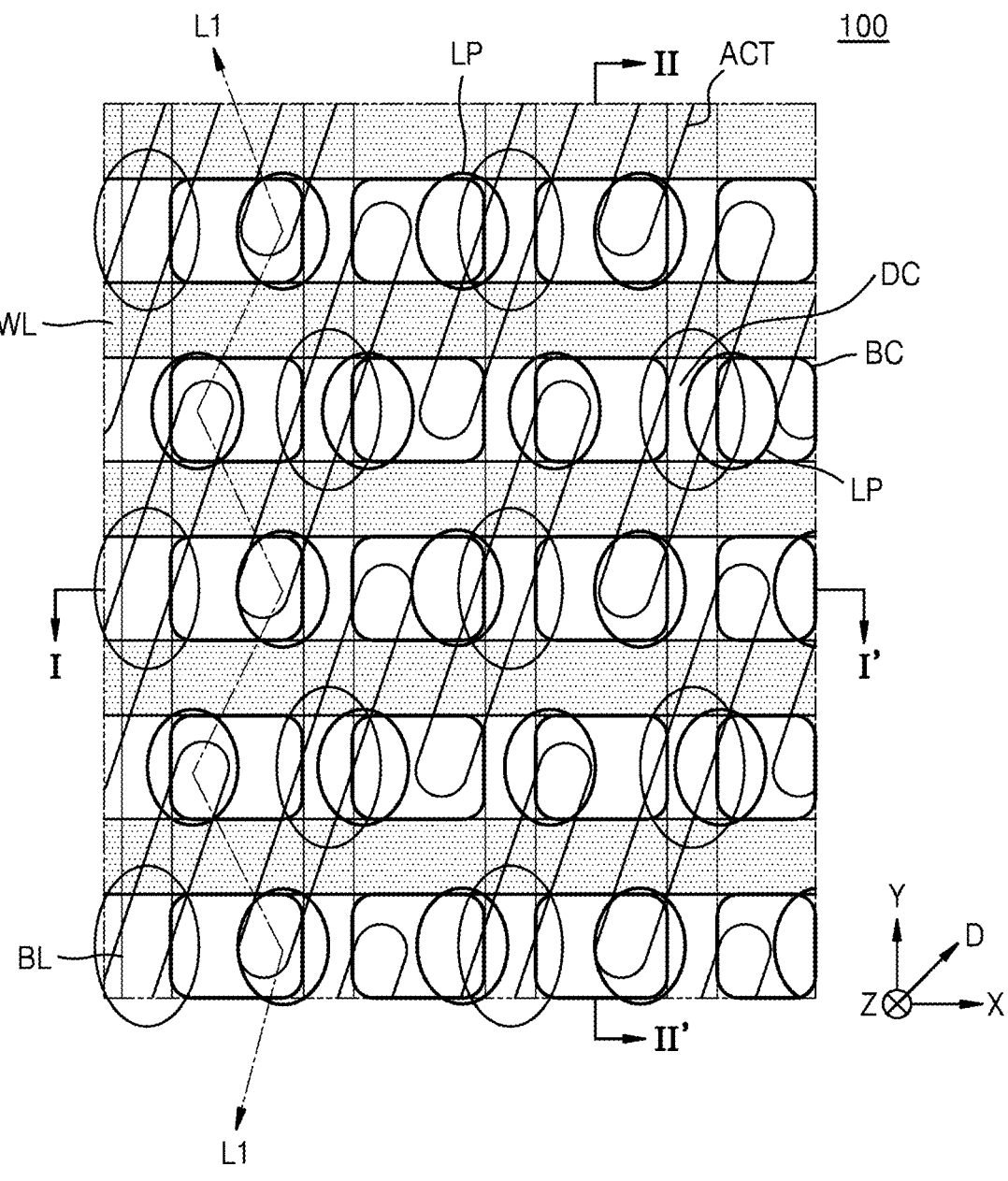
FIG. 1 is a schematic layout diagram of a semiconductor device according to an embodiment of the present inventive concept.

FIG. 1 is a schematic layout diagram of a semiconductor device according to an embodiment of the present inventive concept.

In particular, a semiconductor device 100 according to an embodiment of the present inventive concept may be a memory device, for example, a dynamic random access memory (DRAM) device. The semiconductor device 100 may include a plurality of active areas ACT. The wording of "area" may be referred to as "region" in embodiments of the present inventive concept. The active area ACT may be defined through a plurality of non-active areas 114 in FIGS. 3A and 3B formed on a substrate 110 in FIG. 2. In an embodiment, the active area ACT may be arranged in a diagonal direction (I) direction).

The non-active areas 114 may be referred to as a device isolation areas. As design rules of the semiconductor device 100 are reduced, the active area ACT of the semiconductor device 100 may be arranged in the form of a diagonal line or an oblique line bar as shown.

A plurality of word lines WL or gate lines extending parallel to each other in the second direction (X direction) across the active area ACT may be disposed on the active area ACT. The word line WL may be a conductive line. The word lines WL may be arranged at equal spacing from each other, such as in a first direction (V direction) that crosses the second direction (X direction). For example, in an embodiment the first and second directions (X and Y directions) may be orthogonal to each other. The width of the word lines WL or the spacing between the word lines WL may be determined according to a design rule.

A plurality of bit lines BL extending in parallel to each other in the first direction (Y direction) orthogonal to the word line WL may be disposed on the word line WL. The bit line BL may be a conductive line. The bit lines BL may also be arranged at equal spacing from each other, such as in the second direction (X direction). The width of the bit line BL or the spacing between the word lines BL may be determined according to a design rule.

In an embodiment, the bit lines BL may each have a pitch of 3F and may be disposed parallel to each other. The word lines WL may each have a pitch of 2F and may be disposed parallel to each other, Here, F may mean a minimum lithographic feature size, and when the bit lines BL and the word lines WL are disposed with the above pitch spacing, the semiconductor device 100 may include a memory cell having a unit cell size of 6F2.

The semiconductor device 100 according to an embodiment of the present inventive concept may include various contacts formed on an active area ACT, for example, a direct contact DC, a buried contact BC, a landing pad LP, and the like, Here, the direct contact DC may refer to a contact connecting the active area ACT to the bit line BL, and the buried contact BC may refer to a contact connecting the active area ACT to the lower electrode of the capacitor.

In general, the contact area between the buried contact BC and the active area ACT may be very small due to the layout structure. Accordingly, the conductive landing pad LP may be introduced for the contact area expansion with the lower electrode of the capacitor in addition to the contact area expansion with the active area ACT.

The landing pad LP may be disposed both between the active area ACT and the buried contact BC, between the buried contact BC and the lower electrode of the capacitor, or between the active area ACT and the buried contact BC, and between the buried contact BC and the lower electrode of the capacitor in a third direction (Z direction) perpendicular to the X-Y plane. As described above, by expanding the contact area through the introduction of the landing pad LP, the contact resistance between the active area ACT and the capacitor lower electrode may be reduced.

In the semiconductor device 100 of an embodiment, the direct contact DC may be disposed at a central portion of the active area ACT, and the buried contact BC may be disposed at both end portions of the active area ALL As the buried contact BC is disposed at both ends of the active area ACT, the landing pad LP is adjacent to both ends of the active area ACT and may be disposed to partially overlap the buried contact BC.

The word line WL is formed in a structure buried in the substrate of the semiconductor device 100 and may be disposed across the active area ACT between the direct contacts DC or the buried contacts BC. As shown in FIG. 1, two word lines WL are arranged to cross one active area ACT, and the active area ACT is arranged in an oblique shape, so that the active area ACT may have a preset angle less than 90° with respect to the word line WL.

The direct contact DC and the buried contact BC may be symmetrically disposed in the second direction (X direction). In an embodiment, the direct contact DC and the buried contact BC may be disposed on a straight line in the first direction (Y direction) and the second direction (X direction). Unlike the direct contact DC and the buried contact BC, the landing pad LP may be disposed in a zigzag shape LI in the first direction (Y direction) in which the bit line BL extends.

The landing pad LP may be disposed to overlap the same side portion of each bit line BL in the second direction (X direction) in which the word line WL extends. For example, in an embodiment each of the landing pads LP of the first line may overlap the left side of the corresponding bit line BL, and each of the landing pads LP of the second line may overlap the right side of the corresponding bit line BL.

Figure 2:
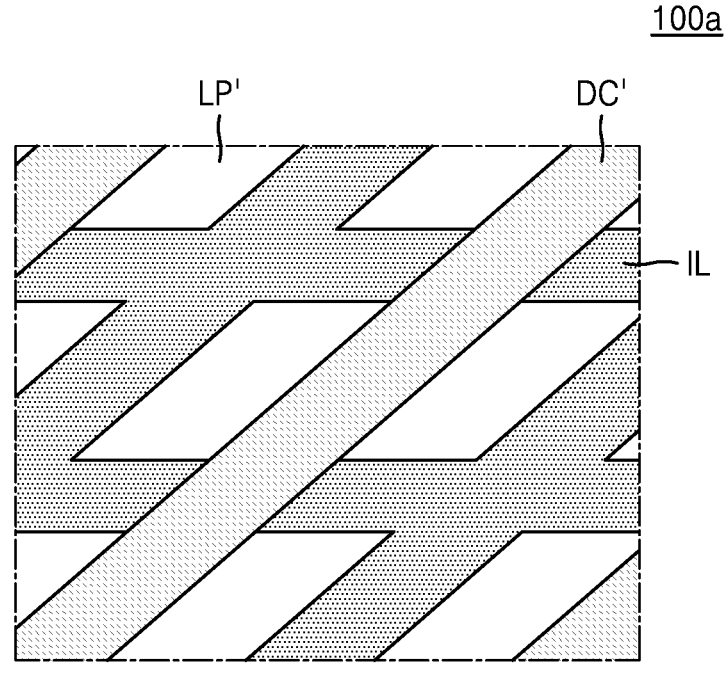
FIG. 2 is a schematic layout diagram of a semiconductor device according to an embodiment of the present inventive concept.
Figure 2:
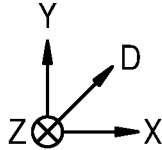

FIG. 2 is a schematic layout diagram of a semiconductor device according to an embodiment of the present inventive concept.

In an embodiment, a semiconductor device 100a may be the same as that of FIG. 1, except that the arrangement of the direct contact DC' and the landing pad LP' is different. In FIG. 2, descriptions of contents overlapping those of FIG. 1 will be omitted for convenience of explanation.

The semiconductor device 100a includes a direct contact DC' extending in a diagonal direction (direction D). The direct contact DC' may be in the form of a line. The direct contacts DC' may be disposed to be spaced apart from each other in the second direction (X direction).

The semiconductor device 100a may include landing pads LP' positioned on both lateral sides of the direct contact DC' in the second direction (X direction). The landing pad LP' may be arranged parallel to the second direction (X direction). The landing pad LP' may be disposed in parallel in a diagonal direction (I) direction).

The landing pad LP' may be insulated from each other by an insulating layer IL. In an embodiment, the landing pads LP' may be separated from each other by the insulating layer IL in the second direction (X direction) and the first direction (Y direction). The buried contact BC of FIG. 1 may be disposed under the landing pad LP' in a third direction (Z direction) perpendicular to the X-Y plane.

Figure 3A:
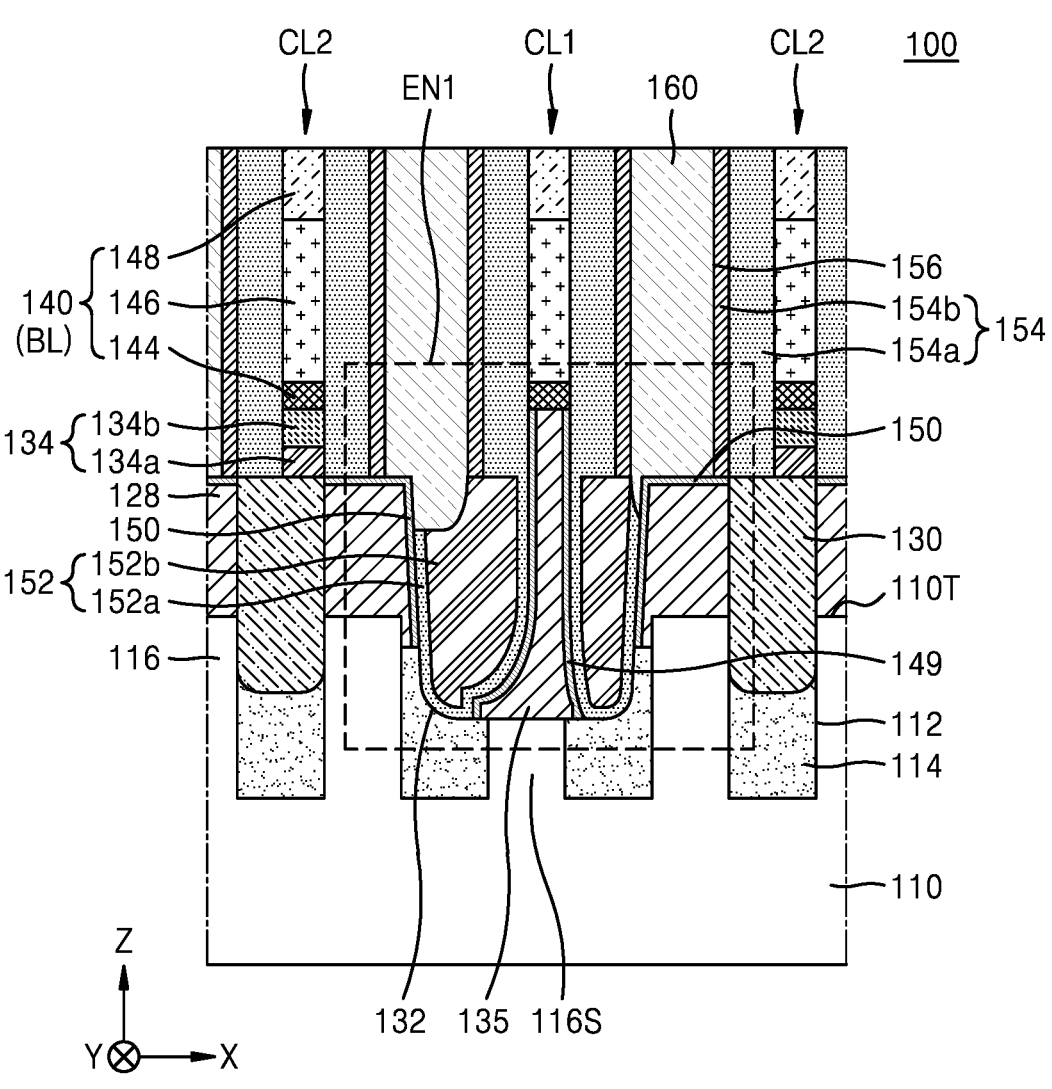
FIG. 3A is a cross-sectional view of a main part of a semiconductor device according to an embodiment of the present inventive concept.
Figure 3B:
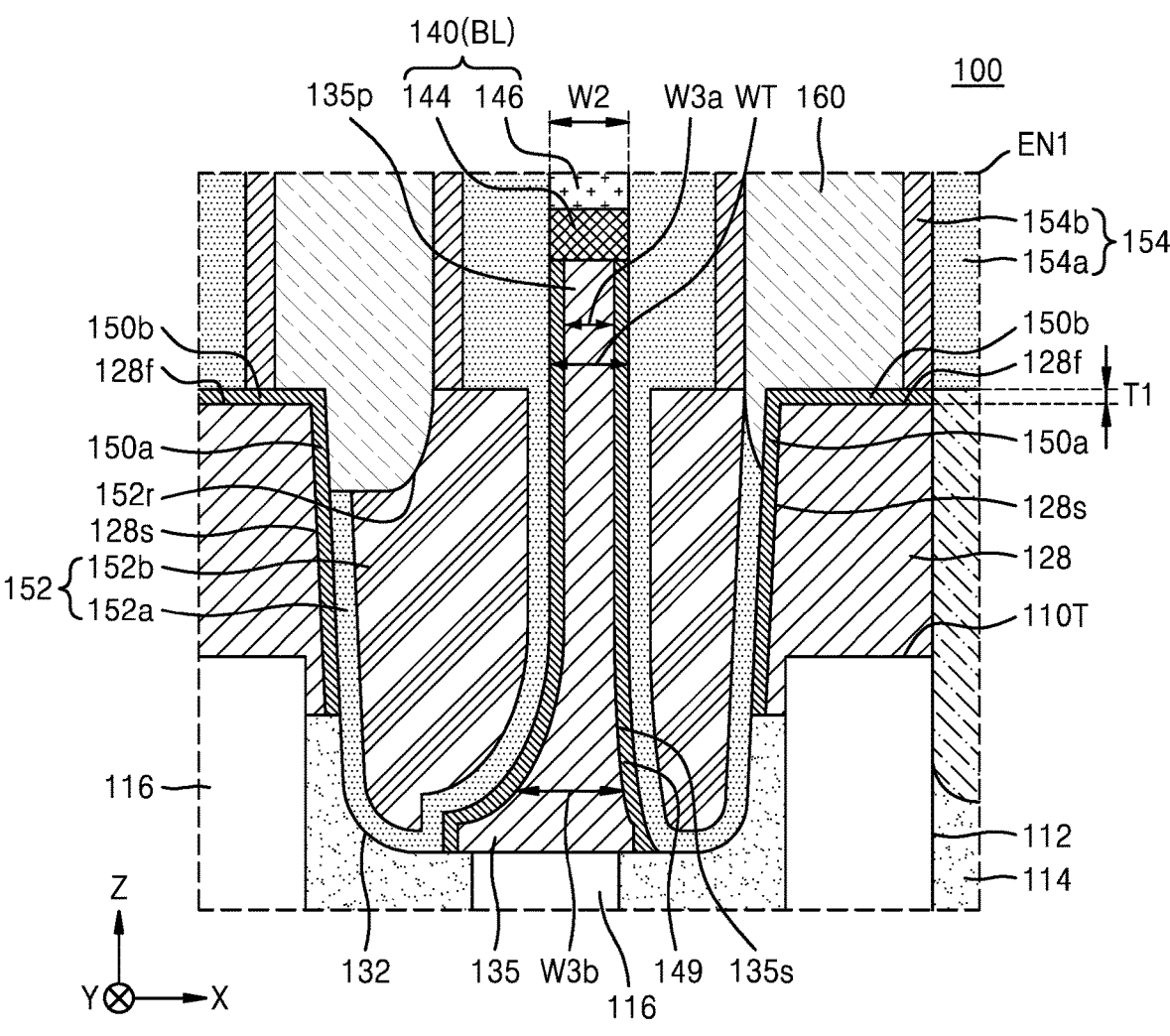
FIG. 3B is an enlarged cross-sectional view of a portion EN1 of FIG. 3A according to an embodiment of the present inventive concept.

FIG. 3A is a cross-sectional view of a main part of a semiconductor device according to an embodiment of the present inventive concept, and FIG. 3B is an enlarged view of a portion EN1 of FIG. 3A.

The semiconductor device 100 in FIG. 3A may be a partial cross-sectional view taken along line I-I' of FIG. 1. In FIGS. 3A and 3B, the landing pad LP and the capacitor are not shown for convenience of explanation. In FIGS. 3A and 3B, the same reference numerals as in FIG. 1 denote the same members and a repeated description of similar or identical elements may be omitted for convenience of explanation.

The semiconductor device 100 may include a substrate 110 having the active area 116 and ACT in FIG. 1 defined by a non-active area 114. In an embodiment, the substrate 110 may include silicon Si, such as crystalline Si, polycrystalline Si, or amorphous Si.

In an embodiment, the substrate 110 may include a compound semiconductor such as germanium (Ge), or SiGe, silicon carbide (SiC), gallium arsenide (GaAs), indium arsenide (InAs), or indium phosphide (InP). In sonic embodiments, the substrate 110 may include a conductive area, such as a well doped with an impurity, or a structure doped with an impurity.

The non-active area 114 may include a device isolation layer buried in the trench for device isolation 112 formed in the substrate 110. In an embodiment, the device isolation layer may be composed of a silicon oxide layer or a silicon nitride layer.

An extra pad layer 128 is formed on (e.g., disposed on) the active area 116 of the substrate 110. The extra pad layer 128 may also be formed on (e.g., disposed on) a part of the non-active area 114. In an embodiment, the extra pad layer 128 may be formed of a polysilicon layer doped with impurities. The extra pad layer 128 may be provided to increase the contact area with the second contact layer 160 and to easily contact the second contact layer 160.

A pad isolation insulating layer 130 that insulates the extra pad layer 128 may be formed on the non-active area. 114 of the substrate 110. In an embodiment, the pad isolation insulating layer 130 may be formed of a silicon insulating layer or a silicon oxide layer.

The semiconductor device 100 may include a first contact hole 132 formed (e.g., defined) inside the substrate 110 from the surface 128$f$ of the extra pad layer 128. The first contact hole 132 may be positioned below the surface 110T of the substrate 110. A first contact layer 135 may be formed in the first contact hole 132.

In an embodiment, the first contact layer 135 may be formed of a polysilicon layer doped with impurities. The first contact layer 135 may extend in a vertical direction (Z direction) perpendicular to the surface 110T of the substrate 110. The first contact layer 135 may include a protrusion part 135$p$ that protrudes from the surface 128$f$ (e.g., an upper surface) of the extra pad layer 128.

The first contact layer 135 may have an upper width W3$a$ and a lower width W3$b$. In an embodiment, the upper width W3$a$ of the first contact layer 135 may be less than a width W2 of the first conductive layer CL1, such as the bit line 140 and BL. In an embodiment, the first contact layer 135 may have the upper width W3$a$ and lower width W3$b$ that are identical to each other unlike an embodiment shown in FIG. 3A.

In some embodiments, the upper width W3$a$ and the lower width W3$b$ may be different from each other as shown in FIG. 3A. In some embodiments, as shown in FIG. 3A, the lower width W3$b$ may be greater than the upper width W3$a$.

In some embodiments, the lower width W3$b$ may be less than the upper width W3$a$ unlike an embodiment shown in FIG. 3A.

The first contact layer 135 may have a profile that gradually increases in width from top to bottom. Accordingly, the first contact layer 135 may be stably disposed on the active area 116.

A first silicide layer 149 may be formed on both sidewalls 135$s$ of the first contact layer 135. In an embodiment, the first silicide layer 149 may be formed of a metal silicide layer, for example, a cobalt silicide layer or a nickel silicide layer. The first silicide layer 149 may have an upper width WT. In an embodiment, the upper width WT of the first silicide layer 149 may be the same as the width W2 of the first conductive layer CL1, such as the bit line 140 and The first contact layer 135 and the first silicide layer 149 may be in direct contact with the active area 116. The first contact layer 135 and the first silicide layer 149 may be a direct contact DC electrically connected to the active area 116. The first contact layer 135 and the first silicide layer 149 may be first contact plugs in direct contact with the active area. 116 of the substrate 110. The first contact layer 135 and the first silicide layer 149 may be in direct contact with the source region 116S formed on the substrate 110.

A buried insulating layer 152 is buried in the first contact hole 132 on both lateral sides of the first contact layer 135 and the first silicide layer 149. The buried insulating layer 152 may include a liner layer 152$a$ formed on the inner wall of the first contact hole 132 and the first silicide layer 149 and a liner buried layer 152$b$ buried in the first contact hole 132 on the liner layer 152$a$. The liner layer 152$a$ may directly contact the first silicide layer 149 and the second silicide layer 150 in the first contact hole 132 and the liner buried layer 152$b$ may fill the first contact hole 132.

In an embodiment, the liner layer 152$a$ and the liner buried layer 152$b$ may be formed of a silicon oxide layer or a silicon nitride layer. For example, in some embodiments, the liner layer 152$a$ and the liner buried layer 152$b$ may be composed of a silicon oxide layer and a silicon nitride layer, respectively.

The buried insulating layer 152 may be formed to protect lower portions of the first contact layer 135 and the first silicide layer 149. The buried insulating layer 152 may be formed to insulate the first contact layer 135 and the first silicide layer 149 from the second contact layer 160.

As shown in FIG. 3B, the second silicide layer 150 may be formed on the sidewalk 128$s$ and the surface 128$f$ (e.g., an upper surface) of the extra pad layer 128. The second silicide layer 150 may have a thickness T1, The second silicide layer 150 may be entirely formed on the sidewalls 128$s$ and the surface 128$f$ of the extra pad layer 128.

The second silicide layer 150 may include a sidewall silicide layer 150$a$ formed on the sidewall 128$s$ of the extra pad layer 128 and a surface silicide layer 150$b$ formed on the surface 128$f$ of the extra pad layer 128. The sidewall silicide layer 150$a$ may be in direct contact with the liner layer 152$a$ constituting the buried insulating layer 152.

In an embodiment, the second silicide layer 150 may be formed of the same material as the first silicide layer 149. In an embodiment, the second silicide layer 150 may be formed of a metal silicide layer, for example, a cobalt silicide layer or a nickel silicide layer.

In the semiconductor device 100, a first conductive layer CL1 is formed on a first contact layer 135 and a first silicide layer 149, and a second conductive layer CL2 is formed on the pad isolation insulating layer 130 with a buffer insulating layer 134 arranged therebetween. The first conductive layer CL1 may be formed on the active area 116 of the substrate 110. The second conductive layer CL2 may be formed on the buffer insulating layer 134 on the non-active area 114 of the substrate 110.

The buffer insulating layer 134 may include a plurality of insulating layers. For example, in an embodiment the buffer insulating layer 134 may include first and second insulating layers 134a and 134b formed on the pad isolation insulating layer 130 on the non-active area. 114. In some embodiments, the first insulating layer 134a and the second insulating layer 134b may include a silicon oxide layer and a silicon nitride layer, respectively.

In an embodiment, the first conductive layer CL1 and the second conductive layer CL2 may be a first conductive line and a second conductive line extending in the first direction (Y direction) on the substrate 110. The first conductive layer CL1 and the second conductive layer CL2 may include the bit line BL and 140. The bit line BL and 140 may be formed of multiple layers as shown.

For example, the bit line BL and 140 may have a stacked structure in which a barrier metal layer 144, a metal layer 146, and a capping insulating layer 148 are sequentially stacked (e.g., in the third direction (Z direction). In an embodiment, the barrier metal layer 144 may be tungsten nitride. The metal layer 146 may be a tungsten layer. The capping insulating layer 148 may be formed of a silicon nitride layer.

In some embodiments, the bit lines BL and 140 may be formed as a single layer differently than shown. For example, the bit lines BL and 140 may be formed of at least one material selected from a semiconductor doped with impurities, a metal, a metal nitride, and a metal silicide.

In the semiconductor device 100, spacers 154 are formed on both sidewalls of the first silicide layer 149 and the first conductive layer CL1 on the protrusion part 135p of the first contact layer 135 and both sidewalls of the buffer insulating layer 134 and the second conductive layer CL2. The spacers 154 may be referred to as multiple spacers. In an embodiment, the spacers 154 may include a first spacer 154a and a second spacer 154b formed on one sidewall of the first spacer 154a. The second conductive layer CL2 may be insulated from the second contact area 160 by the spacers 154.

In an embodiment, the first spacer 154a may be formed of a silicon oxide layer. The second spacer 154b may be formed of a silicon nitride layer. In an embodiment shown in FIG. 3A, two first and second spacers 154a and 154b are formed. However, embodiments of the present inventive concept are not necessarily limited thereto and a larger number of spacers may be included.

The semiconductor device 100 may include a buried insulating layer 152 between the first conductive layer CL1 and the second conductive layer CL2 and a second contact layer 160 in direct contact with the second silicide layer 150 on the second silicide layer 150. The second contact layer 160 may be formed in the second contact hole 156 defined by the spacers 154 and exposing the second silicide layer 150.

In the semiconductor device 100, a recess hole 152r exposing the second silicide layer 150 positioned on a sidewall of the buried insulating layer 152 may be further formed. The second contact layer 160 may be buried in the recess hole 152r. The second contact layer 160 buried in the recess hole 152r may be in direct contact with the sidewall silicide layer 150a and the surface silicide layer 150b.

The second contact layer 160 may be a buried contact BC electrically connected to the active area 116 of the substrate 110. The second contact layer 160 may be a second contact plug contacting the active area 116 of the substrate 110 through the second silicide layer 150 and the extra pad layer 128.

In FIGS. 3A and 3B, the semiconductor device 100 has an asymmetric structure in which its components are asymmetrical in the second direction (X direction) with respect to the first contact layer 135 and the first conductive layer CL1, However, embodiments of the present inventive concept are not necessarily limited thereto. For example, in some embodiments, the semiconductor device 100 has a symmetric structure in which its components are symmetrical in the second direction (X direction) with respect to the first contact layer 135 and the first conductive layer CL1.

The semiconductor device 100 includes a first silicide layer 149 on both sidewalls of the first contact layer 135 so that the connection resistance between the active area 116 of the substrate 110 and the first conductive layer CL1 may be reduced. In addition, in the semiconductor device 100, the first silicide layer 149 may be formed over a large area in the form of a line on the substrate 110 as will be described later, so that the connection resistance between the active area 116 of the substrate 110 and the first conductive layer CL1 may be reduced.

In addition, in the semiconductor device 100, since the first contact layer 135 made of the polysilicon layer does not directly contact the buried insulating layer 152, generation of a depletion layer in the first contact layer 135 may be suppressed.

The semiconductor device 100 includes an extra pad layer 128 and a second silicide layer 150, such that while facilitating contact between the second contact layer 160 and the active area. 116 of the substrate 110, the contact resistance may be reduced.

In addition, the semiconductor device 100 includes an extra pad layer 128, a first silicide layer 149, and a second silicide layer 150, such that the degree of integration may be increased by adjusting the widths of the first contact layer 135, the second contact layer 160, the first conductive layer CL1, and the second conductive layer CL2.

Figure 4:
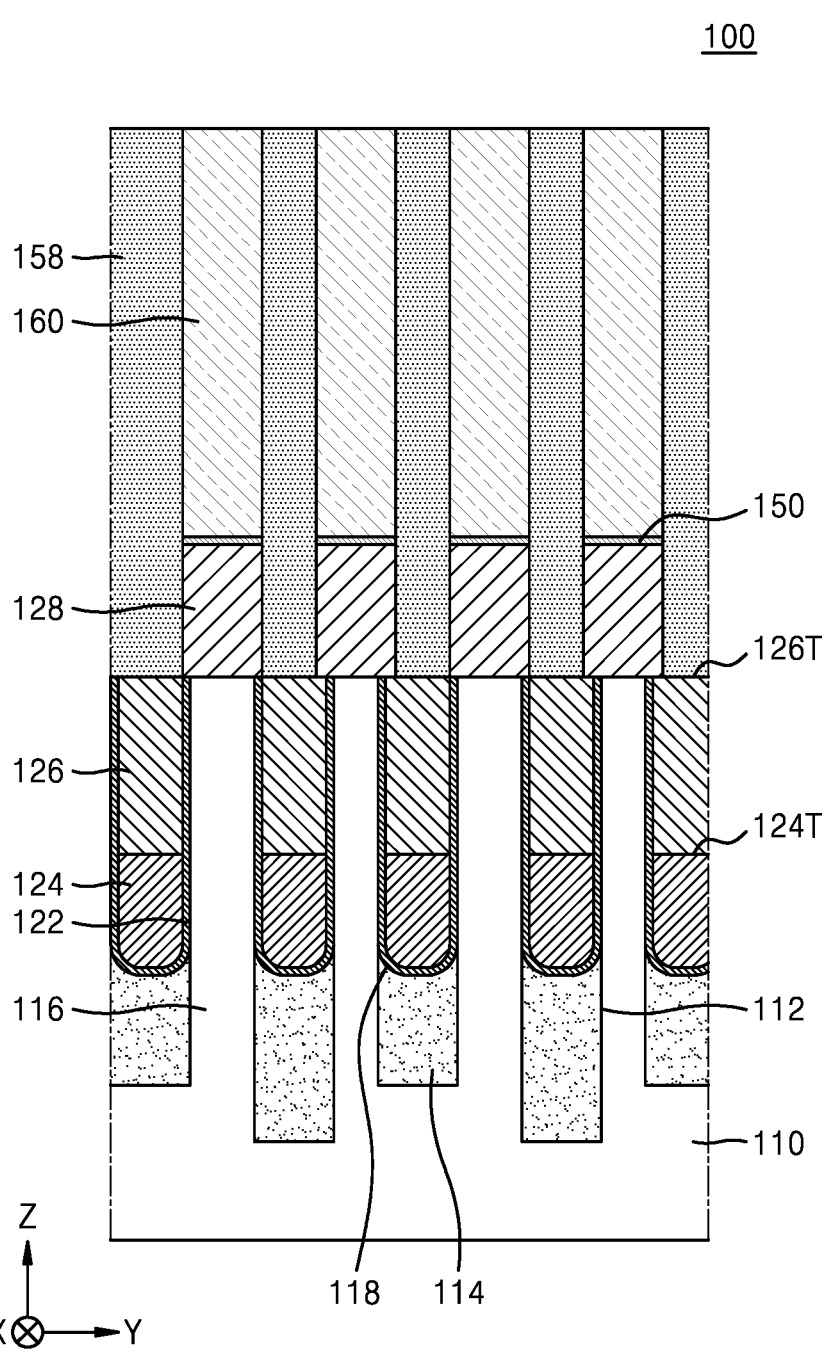
FIG. 4 is a cross-sectional view of a main part of a semiconductor device according to an embodiment of the present inventive concept.

FIG. 4 is a cross-sectional view of a main part of a semiconductor device according to an embodiment of the present inventive concept.

The semiconductor device 100 of FIG. 4 may be a partial main part cross-sectional view taken along line II-II' of FIG. 1. In FIG. 4, the same reference numerals as in FIGS. 1, 3A and 3B denote the same members. In FIG. 4, the contents described with reference to FIGS. 1, 3A and 3B will be briefly described or omitted for convenience of explanation.

The semiconductor device 100 may include a substrate 110 having the active area 116 and ACT in FIG. 1 defined by a non-active area 114 as described above. The non-active area 114 may include a device isolation layer buried in the trench for device isolation 112 formed in the substrate 110.

In the semiconductor device 100, a plurality of word line trenches 118 are formed in a substrate 110. The word line trenches 118 may extend parallel to each other, and may each have a line shape crossing the active area 116.

A gate dielectric layer 122, a word line 124, and a gate cap layer 126 are sequentially formed in the word line trench 118, such as in the third direction (Z direction). The surface 124T of the word line 124 may be lower than the surface 110T in FIG. 3B of the substrate 110. In an embodiment, the word line 124 may be formed of at least one material selected from Ti, TiN, Ta, TaN, W, WN, TiSiN, or WSiN.

In an embodiment, the gate dielectric layer 122 may be formed of at least one material selected from a silicon oxide film, a silicon nitride film, a silicon oxynitride film, an oxide/nitride/oxide (ONO) film, or a high-k dielectric film having a higher dielectric constant than that of a silicon oxide film. For example, in an embodiment the gate dielectric layer 122 may have a dielectric constant in a range of about 10 to about 25.

In some embodiments, the gate dielectric layer 122 may be formed of at least one material selected from hafnium oxide (HfO), hafnium silicon oxide (HfSiO), hafnium oxynitride (HfON), hafnium silicon oxynitride (HfSiON), lanthanum oxide (Lai)), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). Also, the gate dielectric layer 122 may be formed of $HfO_2$, $Al_2O_3$, $HfAlO_3$, $Ta_2O_3$, or $TiO_2$.

The surface 126T of the gate cap layer 126 may be positioned at approximately the same level as the surface 110T (upper surface) of the substrate 110. In an embodiment, the gate cap layer 126 may be formed of a silicon oxide film, a silicon nitride film, a silicon oxynitride film, or a combination thereof.

An extra pad layer 128 is formed on the gate cap layer 126. A second silicide layer 150 is formed on the extra pad layer 128. A second contact layer 160 insulated by an interlayer insulating layer 158 is formed on the second silicide layer 150. In an embodiment, the interlayer insulating layer 158 may be formed of a silicon oxide layer or a silicon nitride layer. The second contact layer 160 may be a buried contact BC electrically connected to the active area 116 of the substrate 110 as described above.

Figure 5:
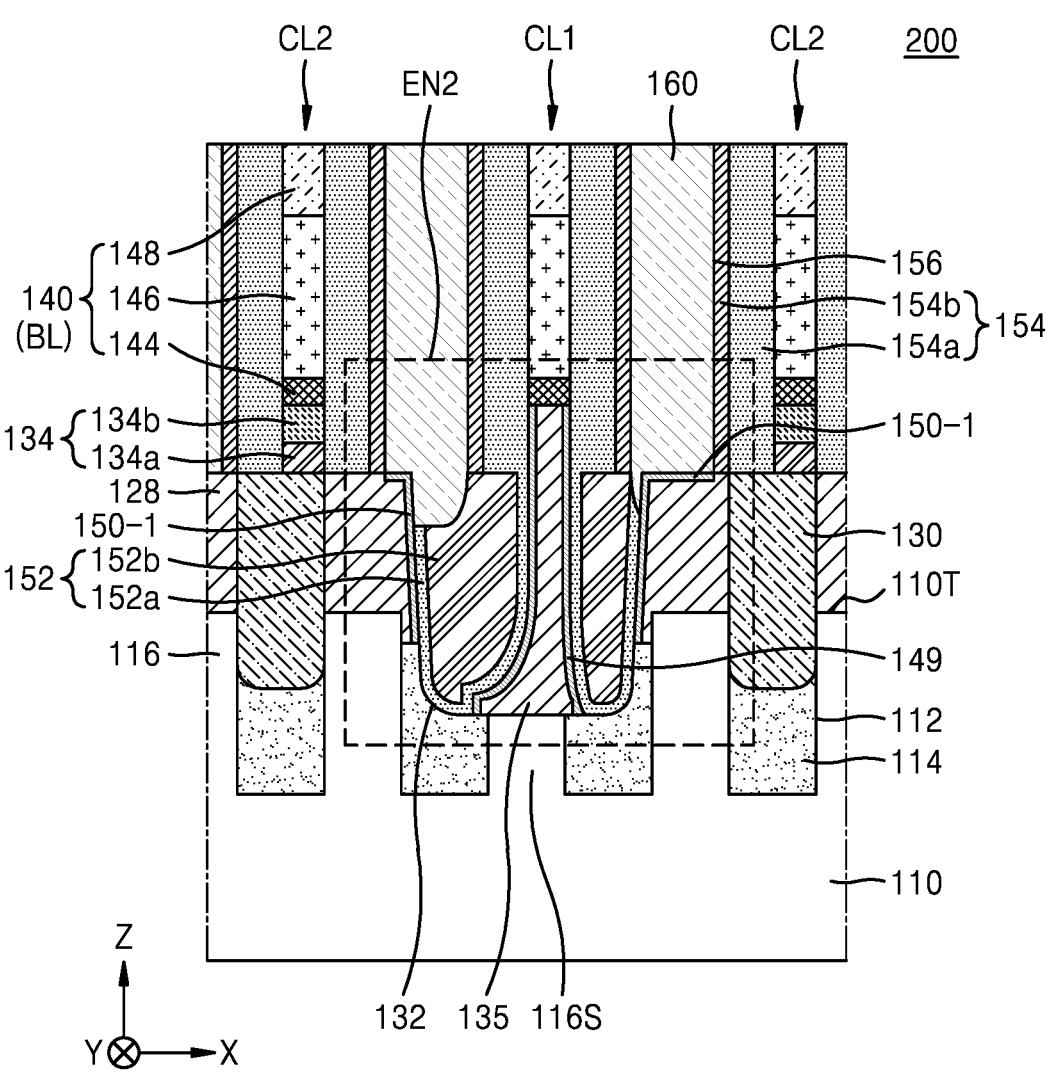
FIG. 5 is a cross-sectional view of a main part of a semiconductor device according to an embodiment of the present inventive concept.
Figure 6:
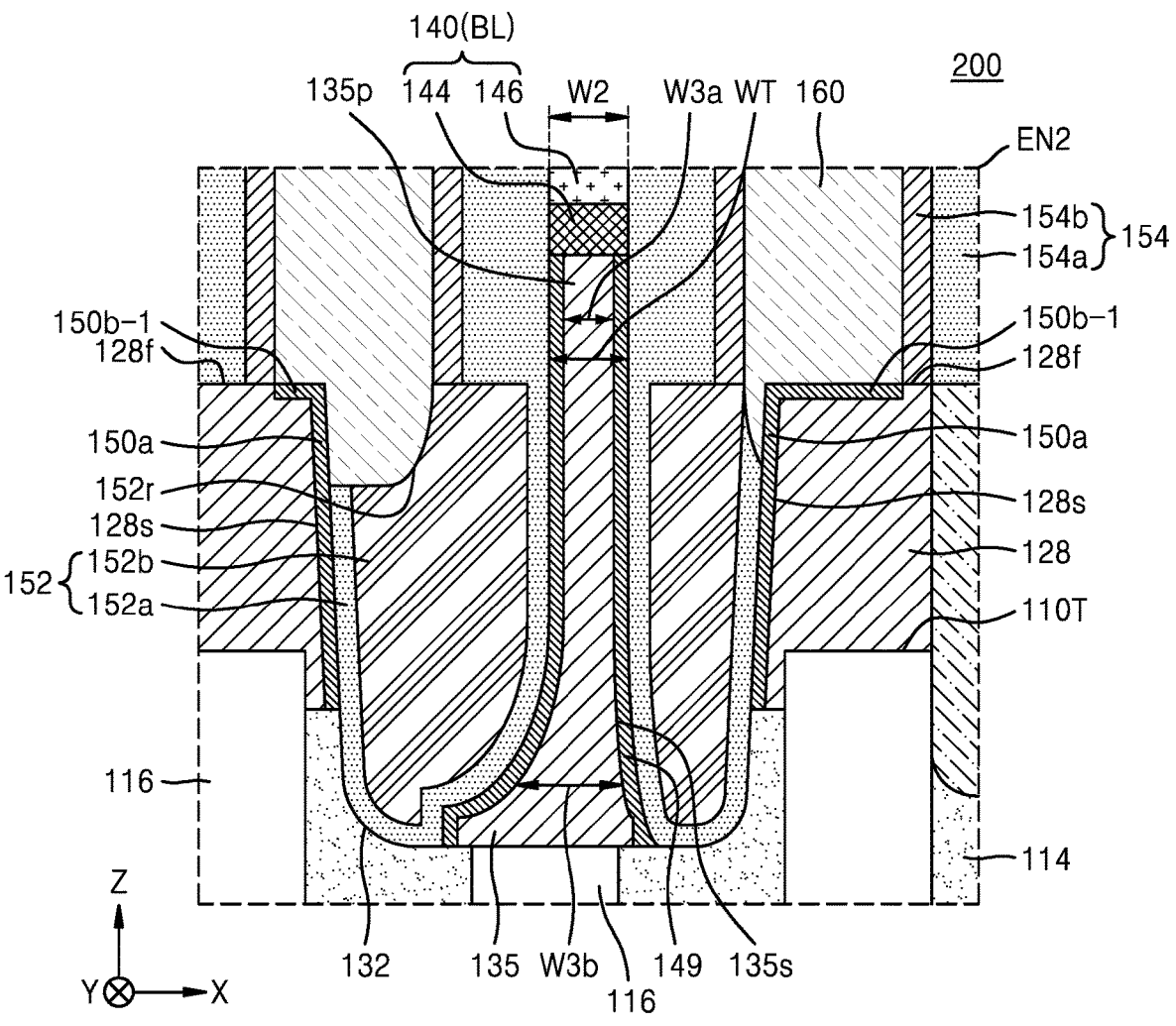
FIG. 6 is an enlarged cross-sectional view of a portion EN2 of FIG. 5 according to an embodiment of the present inventive concept.

FIG. 5 is a cross-sectional view of a main part of a semiconductor device according to an embodiment of the present inventive concept, and FIG. 6 is an enlarged cross-sectional view of a portion EN2 of FIG. 5.

In an embodiment, when compared with the semiconductor device 100 of FIGS. 1, 3A and 3B, the semiconductor device 200 may be the same except that a second silicide layer 150-1 is formed inside (or near) a portion of the surface 128f of the extra pad layer 128. In FIGS. 5 and 6, the same reference numerals as in FIGS. 1, 3A and 3B denote the same members. In FIGS. 5 and 6, the same content as in FIGS. 1, 3A, and 3B will be briefly described or omitted for convenience of explanation.

The semiconductor device 200 of FIG. 5 may be a partial main part cross-sectional view taken along line of FIG. 1. In the semiconductor device 200, an extra pad layer 128 is formed on the active area 116 of the substrate 110. In the semiconductor device 200, a second silicide layer 150-1 may be formed inside the sidewall 128s and a portion of the surface 128f of the extra pad layer 128.

As shown in FIG. 6, the second silicide layer 150-1 may include a sidewall silicide layer 150a formed on an entirety of the sidewall 128s of the extra pad layer 128 and a surface silicide layer 150b-1 formed inside (or near) a portion of the surface 128f of the extra pad layer 128. In an embodiment, the second silicide layer 150-1 may be formed by performing a silicide process after covering a portion of the surface 128f of the extra pad layer 128 with the buffer insulating layer 134 during a manufacturing process.

The surface silicide layer 150b-1 may be formed under the second contact layer 160. The second contact layer 160 may easily contact the active area 116 of the substrate 110 through the second silicide layer 150-1 and the extra pad layer 128.

In addition, when the second silicide layer 150-1 is partially formed inside a portion of the surface 128f of the extra pad layer 128, the separation distance between the second conductive layer CL2 and the surface silicide layer 150b-1 may be increased in the second direction (X direction). Accordingly, the semiconductor device 200 may prevent a short circuit between the second conductive layer CL2 and the surface silicide layer 150b-1.

Figure 7:
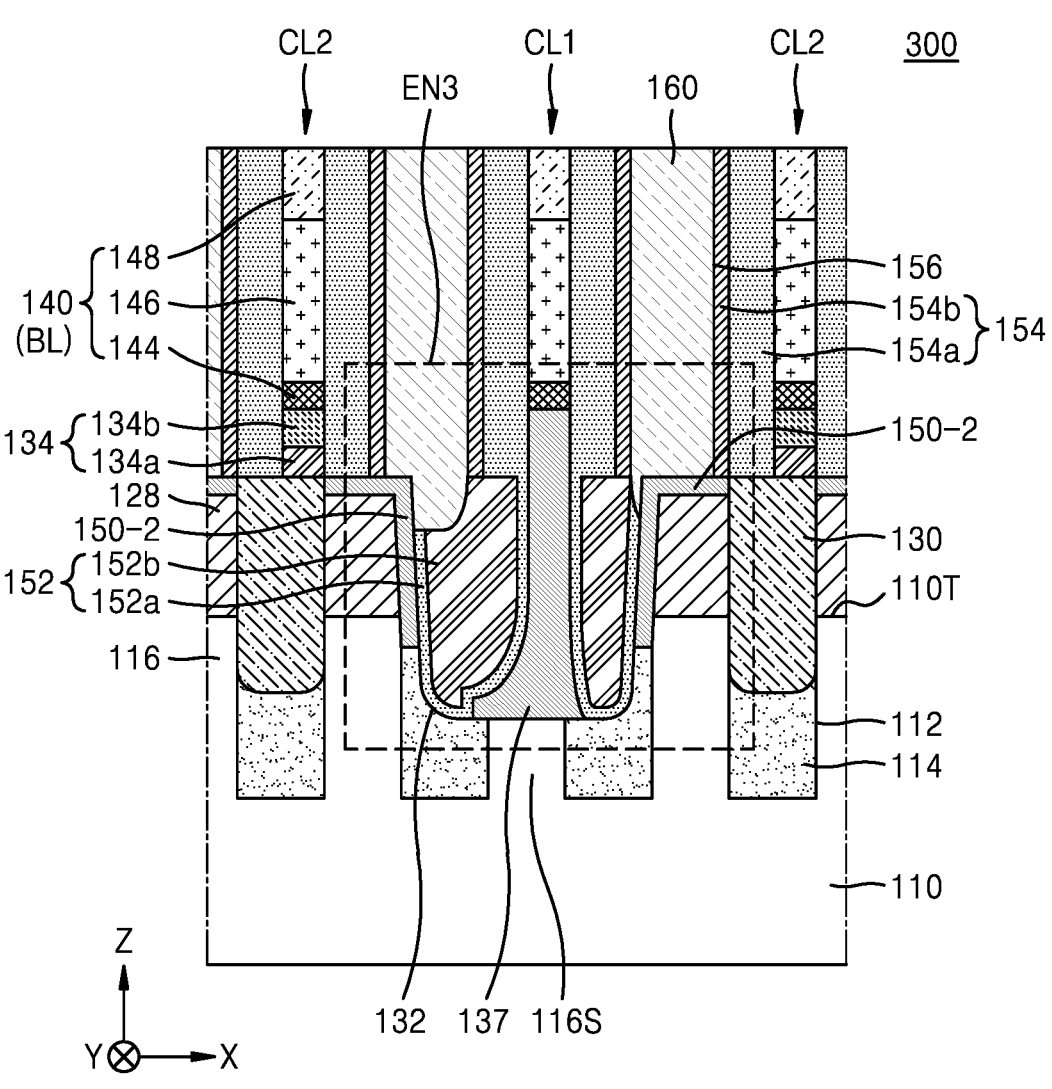
FIG. 7 is a cross-sectional view of a main part of a semiconductor device according to an embodiment of the present inventive concept.
Figure 8:
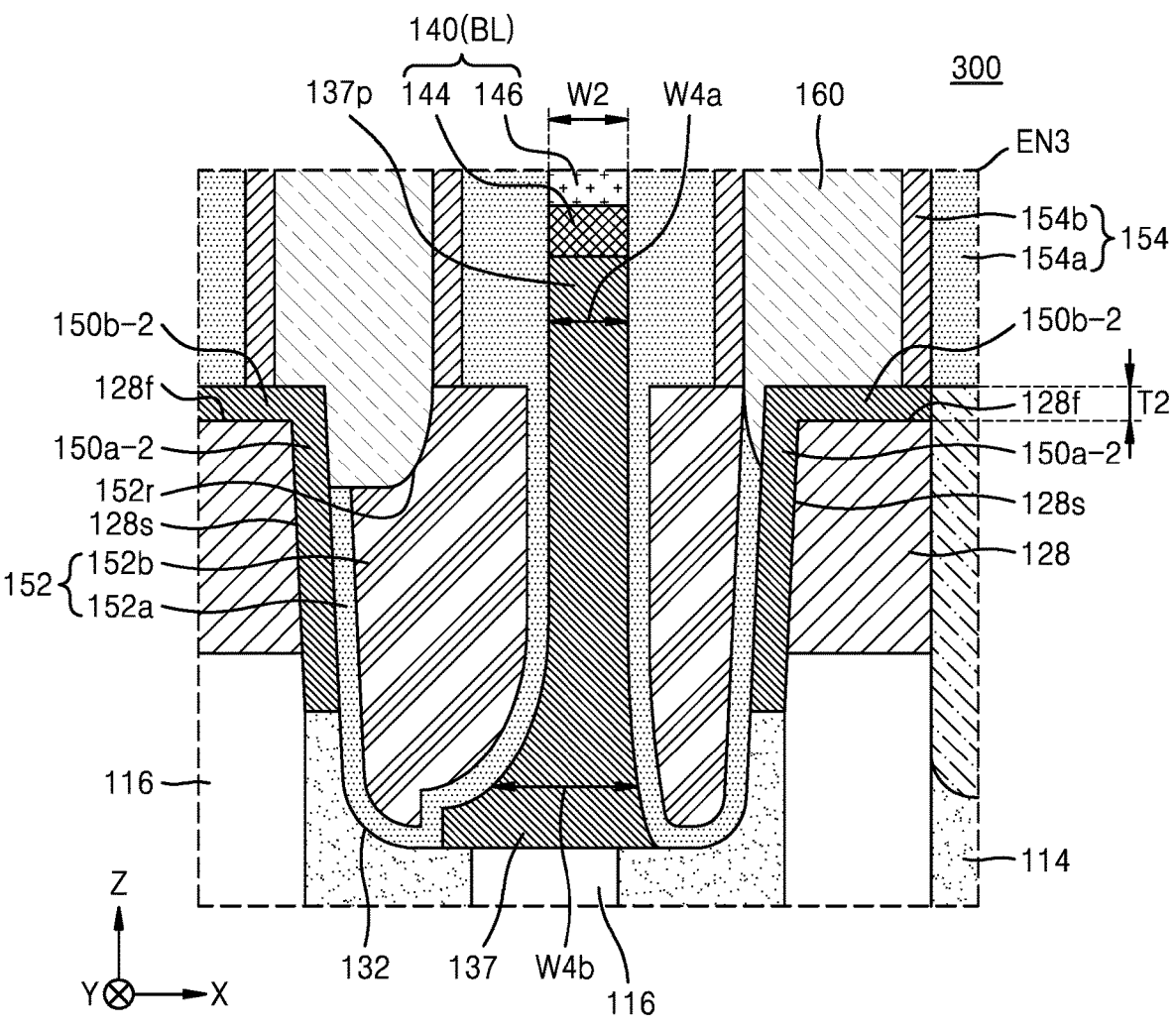
FIG. 8 is an enlarged cross-sectional view of a portion EN3 of FIG. 7 according to an embodiment of the present inventive concept.

FIG. 7 is a cross-sectional view of a main part of a semiconductor device according to an embodiment of the present inventive concept, and FIG. 8 is an enlarged view of a portion EN3 of FIG. 7.

When compared with the semiconductor device 100 of FIGS. 1, 3A and 3B, the semiconductor device 300 may be the same except that the semiconductor device 300 includes a first contact silicide layer 137 and the thickness T2 of the second silicide layer 150-2 is greater than the thickness T1 of the second silicide layer 150. In FIGS. 7 and 8, the same reference numerals as in FIGS. 1, 3A and 3B denote the same members. In FIGS. 7 and 8, the same content as in FIGS. 1, 3A, and 3B will be briefly described or omitted for convenience of explanation.

The semiconductor device 300 may be a partial main part cross-sectional view taken along line I-I' of FIG. 1. In the semiconductor device 300, a first contact silicide layer 137 is formed on the active area 116 of the substrate 110. In the semiconductor device 300, the first contact layer 135 and the first silicide layer 149 of embodiments of FIGS. 1, 3A and 3B may not be separately provided, and the first contact silicide layer 137 may be provided by silicidating the first contact layer 135 as a whole.

The first contact silicide layer 137 may have an upper width W4a and a lower width W4b. The lower width W4b may be greater than the upper width W4a. The first contact silicide layer 137 may have a profile that gradually increases in width from top to bottom. Accordingly, the first contact silicide layer 137 may be stably disposed on the active area 116. However, embodiments of the present inventive concept are not necessarily limited thereto. For example, in some embodiments, the first contact silicide layer 137 may have the upper width W4a and the lower width W4b that are identical to each other.

In an embodiment, the first contact silicide layer 137 may be made of the same material as the second silicide layer 150-2. The first contact silicide layer 137 may be formed of a metal silicide layer, for example, a cobalt silicide layer or a nickel silicide layer. The upper width W4a of the first contact silicide layer 137 may be the same as the width W2 of the first conductive layer CL1, that is, the bit line 140.

The first contact silicide layer 137 may include a protrusion pail 137p that protrudes from the surface 128f of the extra pad layer 128. The first contact silicide layer 137 may be a first contact plug in direct contact with the active area 116 of the substrate 110. The first contact silicide layer 137 may be in direct contact with the source region 116S formed on the substrate 110. When the semiconductor device 300 includes the first contact silicide layer 137 formed of a metal silicide layer, the connection resistance between the active area 116 of the substrate 110 and the first conductive layer CL1, that is, the bit line 140 and 13L, may be reduced.

The semiconductor device 300 may include a second silicide layer 150-2. A thickness T2 of the second silicide layer 150-2 may be thicker than a thickness T1 of the second silicide layer 150 of an embodiment of FIG. 3.

As shown in FIG. 8, the second silicide layer 150-2 may include a sidewall silicide layer 150a-2 formed on the sidewall 128s of the extra pad layer 128 and a surface silicide layer 150b-2 formed on the surface 128f of the extra pad layer 128.

In an embodiment, the second silicide layer 150-2 may be entirely formed on the sidewalls 128s and the surface 128f of the extra pad layer 128. For example, the sidewall silicide layer 150a-2 and the surface silicide layer 150b-2 may be entirely formed on the sidewall 128s and the surface 128f of the extra pad layer 128, respectively.

The semiconductor device 300 may include a second contact layer 160. The second contact layer 160 may be a second contact plug directly contacting the active area 116 of the substrate 110 through the second silicide layer 150-2 and the extra pad layer 128.

When the semiconductor device 300 includes the second silicide layer 150-2 having a thick 12, a contact resistance between the second contact layer 160 and the second silicide layer 150-2 may be reduced.

Figure 9:
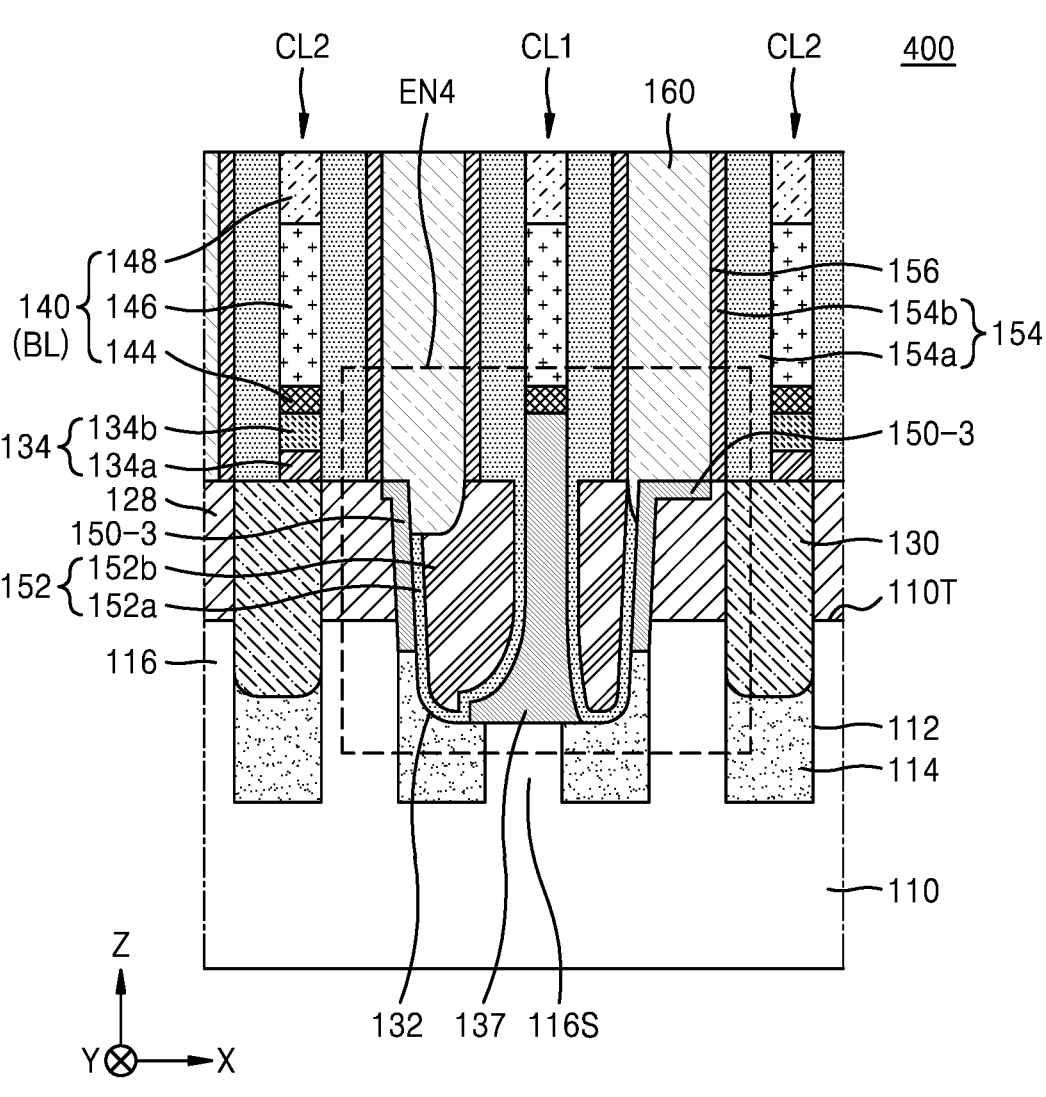
FIG. 9 is a cross-sectional view of a main part of a semiconductor device according to an embodiment of the present inventive concept.
Figure 10:
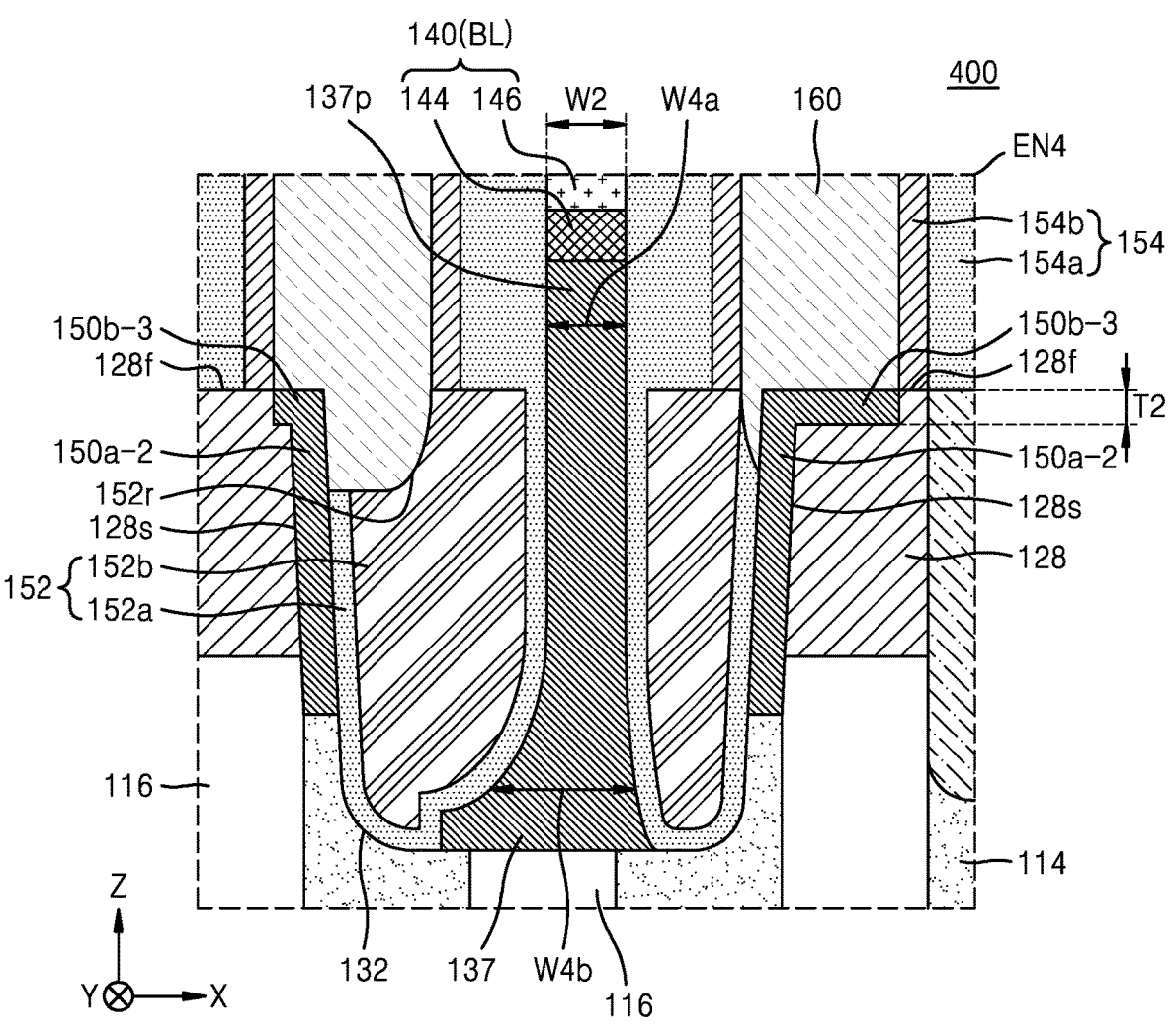
FIG. 10 is an enlarged cross-sectional view of a portion EN4 of FIG. 9 according to an embodiment of the present inventive concept.

FIG. 9 is a cross-sectional view of a main part of a semiconductor device according to an embodiment of the present inventive concept, and FIG. 10 is an enlarged view of a portion EN4 of FIG. 9.

When compared with the semiconductor device 300 of embodiments of FIGS. 7 and 8, the semiconductor device 400 may be the same except that the second silicide layer 150-3 is partially formed inside (or near) the surface 128f of the extra pad layer 128. In FIGS. 9 and 10, the same reference numerals as in FIGS. 1, 3A and 3B, and FIGS. 7 and 8 denote the same members. In FIGS. 9 and 10, the same content as in FIGS. 1, 3A and 3B, and FIGS. 7 and 8 will be briefly described or omitted for convenience of explanation.

The semiconductor device 400 of FIG. 9 may be a partial main part cross-sectional view taken along line I-I' of FIG. 1. In the semiconductor device 400, an extra pad layer 128 is formed on the active area 116 of the substrate 110. In the semiconductor device 400, a second silicide layer 150-3 may be partially formed inside a portion of the sidewall 128s and the surface 128f of the extra pad layer 128.

As shown in FIG. 10, the second silicide layer 150-3 may include a sidewall silicide layer 150a-2 formed on the sidewall 128s of the extra pad layer 128 and a surface silicide layer 150b-3 partially formed inside (or near) a portion of the surface 128f of the extra pad layer 128. In an embodiment, the second silicide layer 150-3 may be formed by performing a silicide process after covering a portion of the surface 128f of the extra pad layer 128 with the buffer insulating layer 134 during a manufacturing process.

The surface silicide layer 150b-3 may be formed under the second contact layer 160. The second contact layer 160 may easily contact the active area 116 of the substrate 110 through the second silicide layer 150-3 and the extra pad layer 128.

In addition, when the second silicide layer 150-3 is partially formed inside a portion of the surface 128f of the extra pad layer 128, the separation distance between the second conductive layer CL2 and the surface silicide layer 150b-3 may be increased in the second direction (X direction). Accordingly, the semiconductor device 400 may prevent a short circuit between the second conductive layer CL2 and the surface silicide layer 150b-1.

FIGS. 11 to 16 are diagrams for explaining a method of manufacturing a semiconductor device according to embodiments of the present inventive concept.

FIGS. 11 to 16 may be diagrams for explaining a method of manufacturing the semiconductor device 100 of FIGS. 1, 3A, and 3B, FIGS. 11 to 16 may be diagrams for explaining a method of manufacturing the semiconductor device 100 of FIGS. 3A and 3B.

Figure 12:
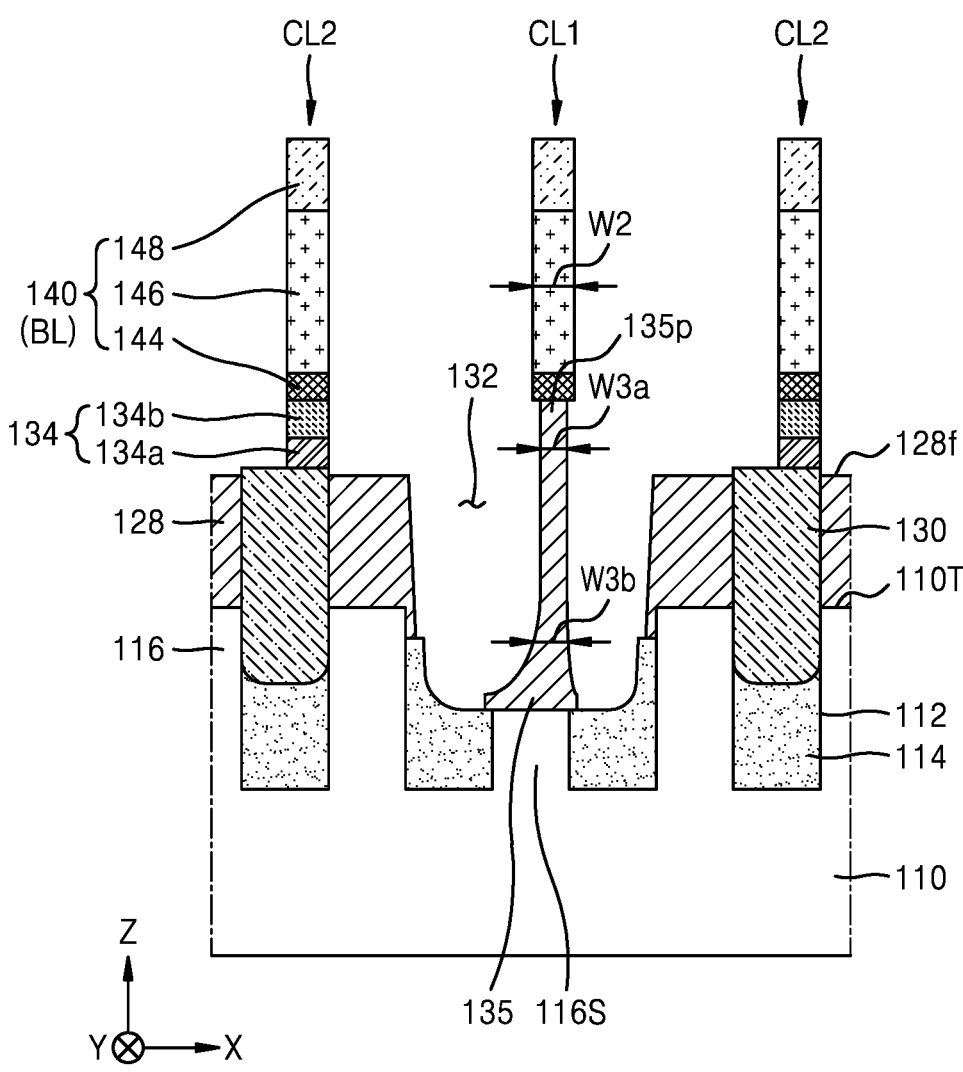
Figure 13:
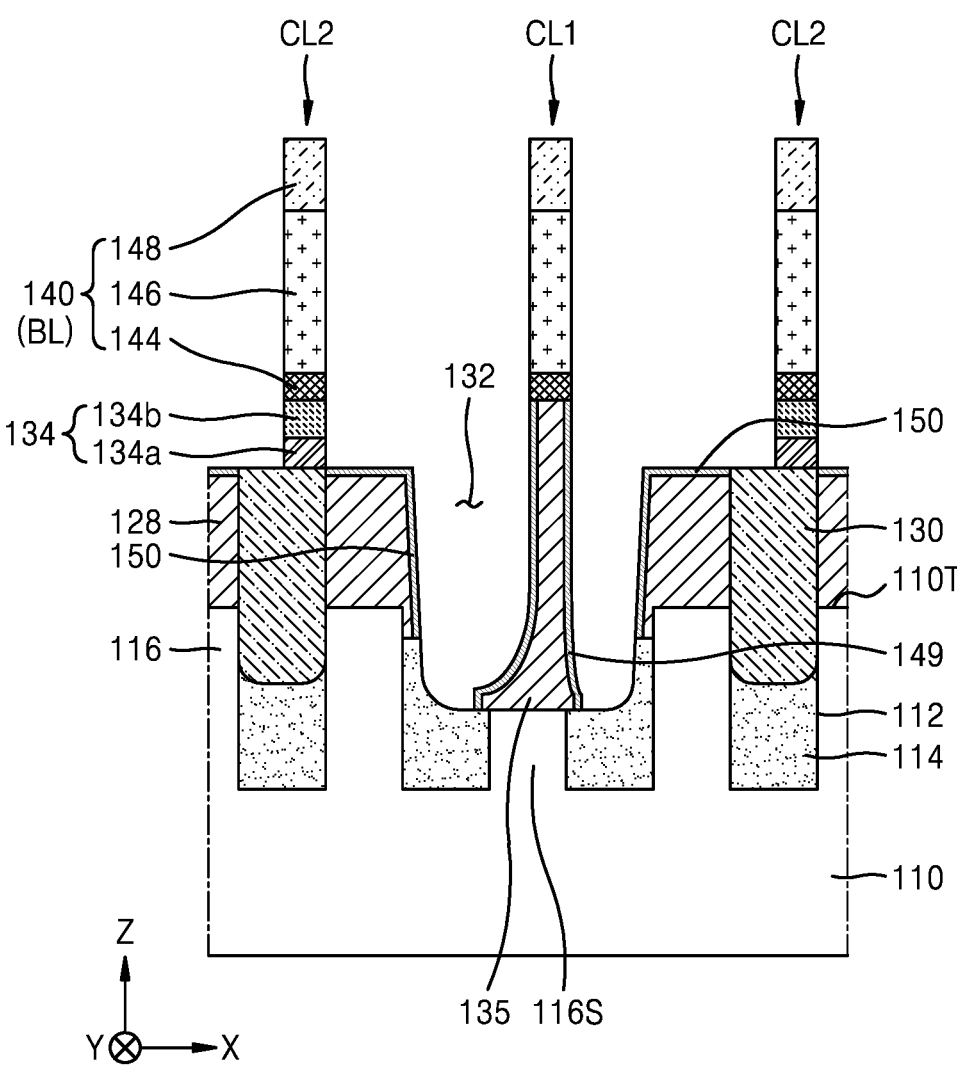
Figure 14:
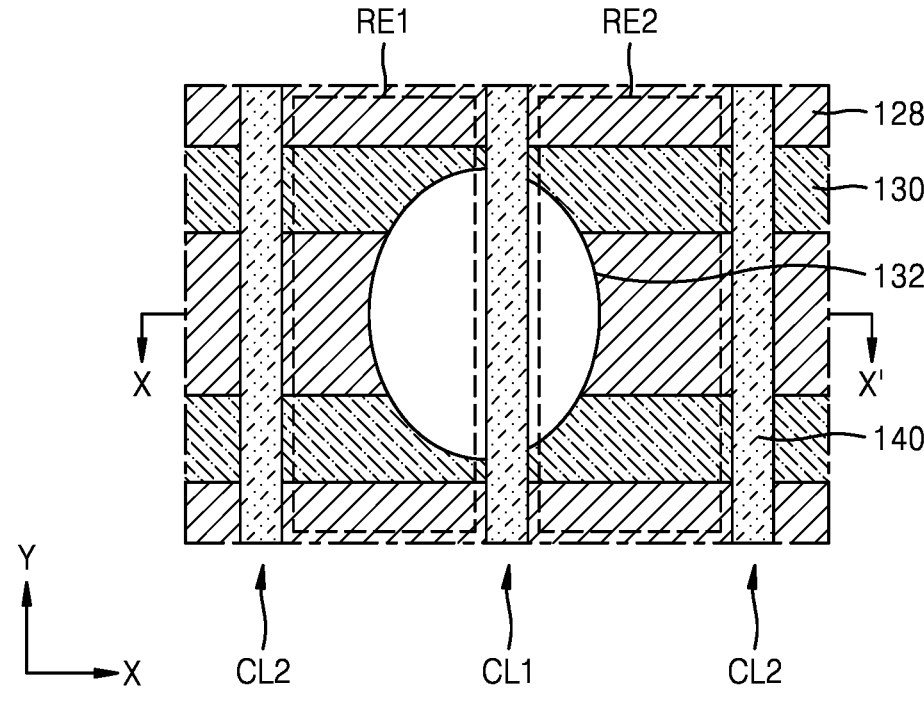

FIGS. 11 to 13, 15 and 16 are cross-sectional views during the manufacturing process of the semiconductor device 100, and FIG. 14 is a plan view of the semiconductor device 100 during the manufacturing process. In FIGS. 11 to 16, the same reference numerals as in FIGS. 1, 3A and 3B denote the same members. In FIGS. 11 to 16, the same content as in FIGS. 1, 3A, and 3B will be briefly described or omitted for convenience of explanation.

Figure 11:
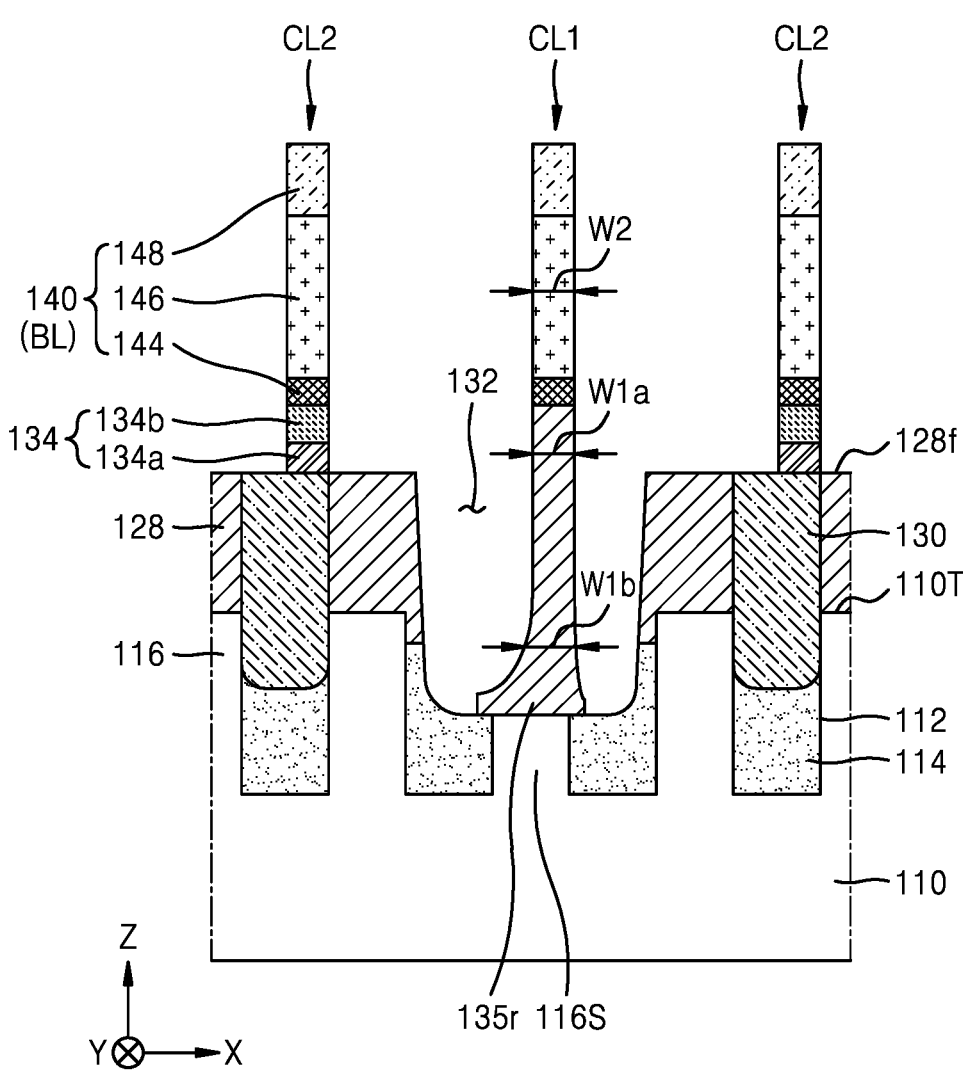
FIGS. 11 to 16 are diagrams of a method of manufacturing a semiconductor device according to embodiments of the present inventive concept.

Referring to FIG. 11, an active area 116 defined by a non-active area 114 on the substrate 110 is defined. In an embodiment, the non-active area 114 may be formed by embedding a device isolation layer in the trench for device isolation 112 of the substrate 110.

The extra pad layer 128 and the pad isolation insulating layer 130 are formed on the substrate 110 having the non-active area 114 and the active area 116. The extra pad layer 128 may be formed on the active area 116 of the substrate 110. In an embodiment, the extra pad layer 128 may be formed of a polysilicon layer doped with impurities. The pad isolation insulating layer 130 insulates the extra pad layer 128. In an embodiment, the pad isolation insulating layer 130 may be formed of a silicon insulating layer or a silicon oxide layer.

A first contact hole 132 is formed inside the substrate 110 from the surface 128f of the extra pad layer 128. The first contact hole 132 may be positioned below the surface 110T of the substrate 110.

A first preliminary contact layer 135r is formed in the first contact hole 132. In an embodiment, the first preliminary contact layer 135r may be formed of a polysilicon layer doped with impurities. The first preliminary contact layer 135r, such as a lower surface of the first preliminary contact layer 135r, may be in direct contact with the source region 116S formed on the substrate 110.

The first preliminary contact layer 135r may have an upper width W1a and a lower width W1b. The lower width W1b may be greater than the upper width W1a. In an embodiment, the first preliminary contact layer 135r may have a profile that gradually increases in width from top to bottom. Accordingly, the first preliminary contact layer 135r may be stably disposed on the active area 116. However, embodiments of the present inventive concept are not necessarily limited thereto. For example, in some embodiments, the first preliminary contact layer 135r may have the upper width W1a and the lower width W1b identical to each other.

A buffer insulating layer 134 is formed on the pad isolation insulating layer 130. The buffer insulating layer 134 may be formed of a plurality of insulating layers. For example, in an embodiment the buffer insulating layer 134 includes first and second insulating layers 134a and 134b formed on the pad isolation insulating layer 130 on the non-active area 114. In some embodiments, the first insulating layer 134a and the second insulating layer 134b may be formed of a silicon oxide layer and a silicon nitride layer, respectively. In some embodiments, the first preliminary contact layer 135r and the buffer insulating layer 134 may be formed by the same process.

A first conductive layer CL1 is formed on the first preliminary contact layer 135r. In an embodiment, the width W2 of the first conductive layer CL1 may be the same as the upper width W1a of the first preliminary contact layer 135r. A second conductive layer CL2 is formed on the buffer insulating layer 134. In some embodiments, the first conductive layer CL1 and the second conductive layer CL2 may be formed in the same process.

The first conductive layer CU and the second conductive layer CL2 may be a first conductive line and a second conductive line extending in a first direction (Y direction) on the substrate 110. The first conductive layer CL1 and the second conductive layer CL2 may include the bit line BL and 140. The bit line BL and 140 may be formed of multiple layers as shown.

For example, the bit line BL and 140 may have a stacked structure in which a barrier metal layer 144, a metal layer 146, and a capping insulating layer 148 are sequentially stacked (e.g., in the third direction Z). In an embodiment, the barrier metal layer 144 may be tungsten nitride. The metal layer 146 may be a tungsten layer. The capping insulating layer 148 may be formed of a silicon nitride layer.

Referring to FIG. 12, a trimming process of further etching both sidewalls of the first preliminary contact layer 135r of FIG. 11 positioned in the first contact hole 132 is performed. Accordingly, the trimmed first preliminary contact layer 135r may form the first contact layer 135.

The first contact layer 135 may include a protrusion part 135p that protrudes from the surface 128f of the extra pad layer 128. The first contact layer 135 may have an upper width W3a and a lower width W3b. In an embodiment, the lower width W3b may be greater than the upper width W3a. The upper width W3a may be less than the width W2 of the first conductive layer CL1. The first contact layer 135 may have a profile that gradually increases in width from top to bottom.

Accordingly, the first contact layer 135 may be stably disposed on the active area 116. However, embodiments of the present inventive concept are not necessarily limited thereto. For example, in some embodiments, the first contact layer 135 may have the upper width W3a and the lower width W3b that are identical to each other.

Referring to FIGS. 13 and 14, FIG. 13 may be a partial cross-sectional view taken along line X-X' of FIG. 14. As shown in FIG. 13, a first silicide layer 149 is formed on both sidewalk of the first contact layer 135. The second silicide layer 150 is formed entirely on the sidewalls and surfaces of the extra pad layer 128. In an embodiment, the first silicide layer 149 and the second silicide layer 150 may be formed by the same process.

The first silicide layer 149 and the second silicide layer 150 may be formed by silicidating the surface of the polysilicon layer doped with impurities. In the process of forming the first silicide layer 149, when the polysilicon layer constituting the first contact layer 135 is sufficiently silicidated, the above-described first contact silicide layer 137 in FIGS. 7 and S may be formed. In an embodiment, the first silicide layer 149 and the second silicide layer 150 may be formed of a metal silicide layer, for example, a cobalt silicide layer or a nickel silicide layer.

As shown in FIG. 14, the first conductive layer CL1 and the second conductive layer CL2 extend in the first direction (Y direction). The pad isolation insulating layer 130 extends in the second direction (X direction), and the extra pad layer 128 is disposed between the pad isolation insulating layers 130.

The first silicide layer 149 and the second silicide layer 150 may be formed relatively wide in the line regions RE1 and RE2 open in the form of a line between the first conductive layer CIA and the second conductive layer CL2 in the first direction (Y direction). Accordingly, the first silicide layer 149 may lower the contact resistance with the first conductive layer CL1, and the second silicide layer 150 may lower the subsequent contact resistance with the second contact layer 160.

Figure 15:
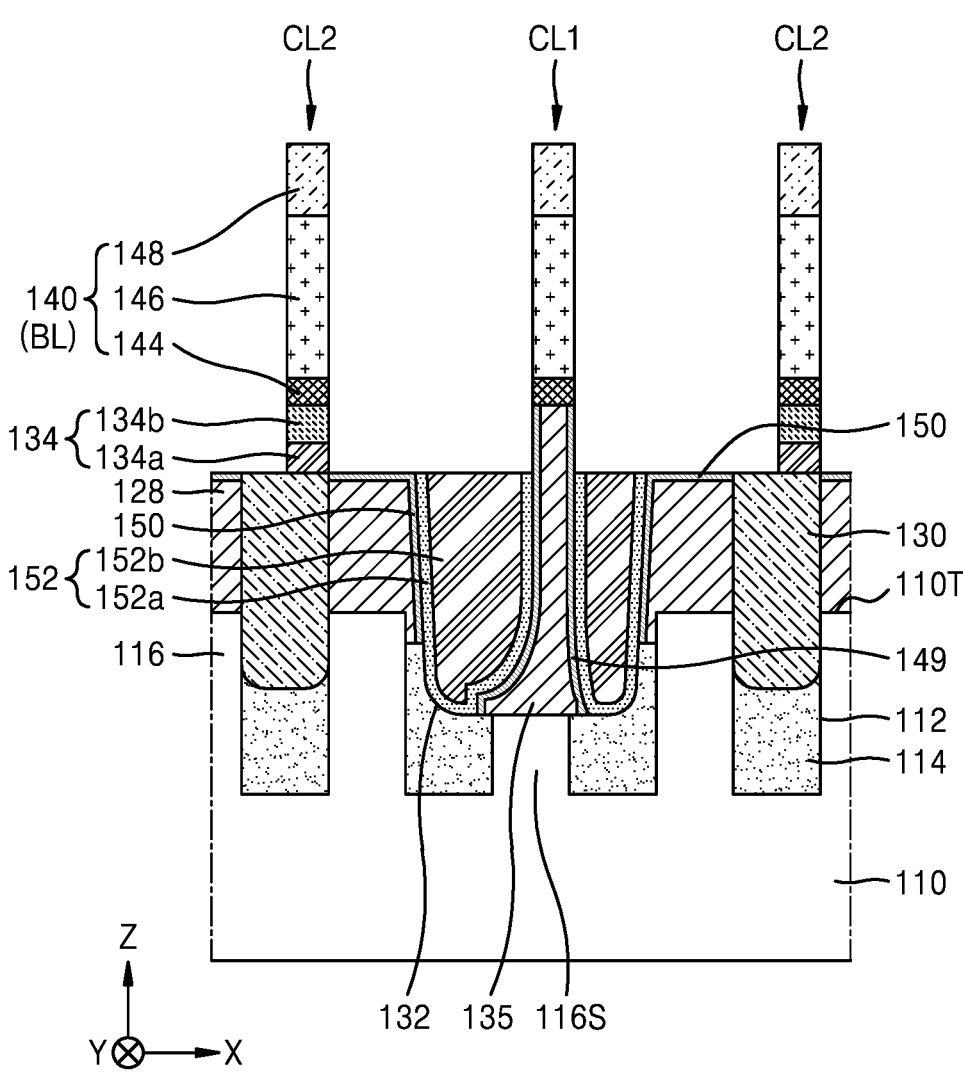

Referring to FIG. 15, the buried insulating layer 152 is buried in the first contact hole 132. The buried insulating layer 152 is formed in the first contact hole 132 on both sides of the first contact layer 135 and the first silicide layer 149. The buried insulating layer 152 includes a liner layer 152a formed on the inner wall of the first contact hole 132 and the first silicide layer 149 and a liner buried layer 152b buried in the first contact hole 132 on the liner layer 152a.

In an embodiment, the liner layer 152a and the liner buried layer 152b may be formed of a silicon oxide layer or a silicon nitride layer. In some embodiments, the liner layer 152a and the liner buried layer 152b may be formed of a silicon oxide layer and a silicon nitride layer, respectively.

Figure 16:
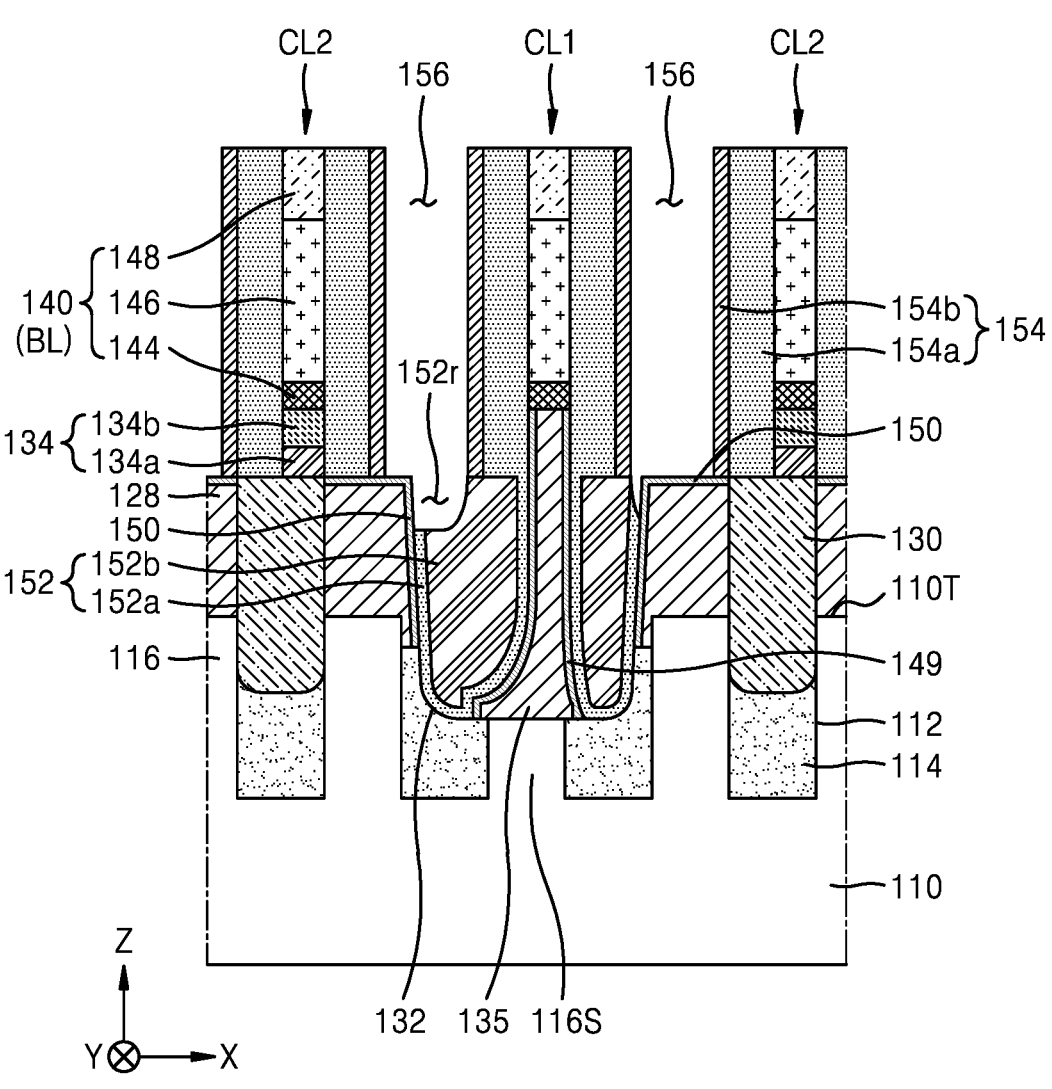

Referring to FIG. 16, spacers 154 are formed on both sidewalk of the first silicide layer 149 and the first conductive layer CL1 on the protrusion part 135p of the first contact layer 135 and both sidewalls of the buffer insulating layer 134 and the second conductive layer CL2. In an embodiment, the spacers 154 include a first spacer 154a and a second spacer 154b formed on one sidewall of the first spacer 154a, in an embodiment, the first spacer 154a is formed of a silicon oxide layer. The second spacer 154b is formed of a silicon nitride layer.

When the spacers 154 are formed, a second contact hole 156 exposing the second silicide layer 150 and the buried insulating layer 152 is formed. When the second contact hole 156 is formed, a recess hole 152r exposing the second silicide layer 150 positioned on the side surface of the buried insulating layer 152 may be formed.

Subsequently, as shown in FIGS. 3A and 3B, a second contact layer 160 is formed in the second contact hole 156 and the recess hole 152r, The second contact layer 160 may contact the buried insulating layer 152 and the second silicide layer 150 between the first conductive layer CL1 and the second conductive layer CL2. The semiconductor device 100 may be manufactured through the manufacturing process described above.

Figure 17:
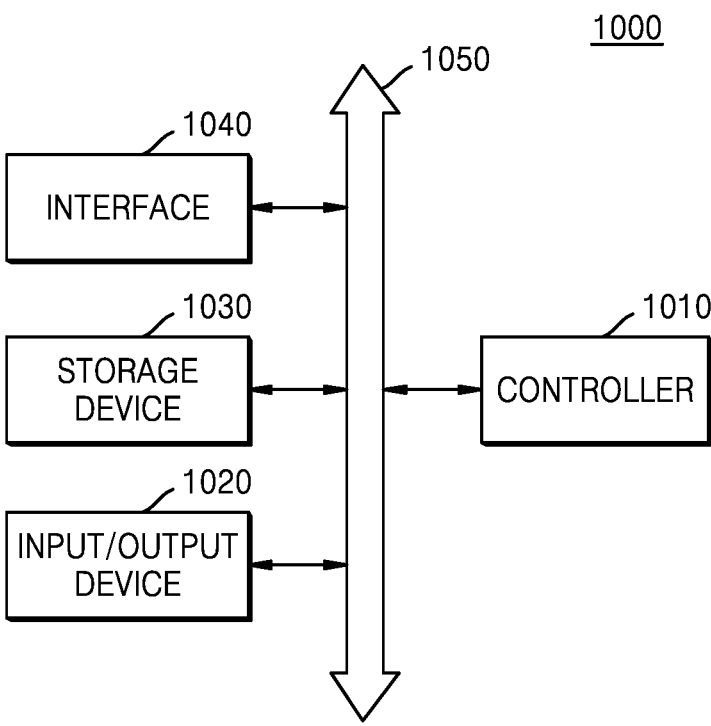
FIG. 17 is a system including a semiconductor device according to an embodiment of the present inventive concept.

FIG. 17 is a system 1000 including a semiconductor device according to an embodiment of the present inventive concept.

In an embodiment, the system 1000 includes a controller 1010, an input/output device 1020, a storage device 1030, and an interface 1040. For example, in some embodiments the system 1000 may be a mobile system or a system that transmits or receives information.

In some embodiments, the mobile system is a personal digital assistant (PD), a portable computer, a web tablet, a wireless phone, a mobile phone, a digital music player, or a memory card. However, embodiments of the present inventive concept are not necessarily limited thereto.

The controller 1010 is for controlling an executable program in the system 1000, and may include a microprocessor, a digital signal processor, a microcontroller, or a similar device.

The input/output device 1020 may be used to input or output data of the system 1000. The system 1000 may be connected to an external device, for example, a personal computer or a network, using the input/output device 1020, and may exchange data with the external device. In an embodiment, the input/output device 1020 may be, for example, a keypad, a keyboard, or a display.

The storage device 1030 may store codes and/or data for the operation of the controller 1010 or data processed by the controller 1010. The storage device 1030 may include at least one of the semiconductor devices 100, 100a, 200, 300, and 400 according to embodiments of the present inventive concept.

The interface 1040 may be a data transmission path between the system 1000 and another external device. The controller 1010, the input/output device 1020, the storage device 1030, and the interface 1040 may communicate with each other via the bus 1050.

In addition, in some embodiments the system 1000 may be used for a mobile phone, an MP3 player, a navigation, a portable multimedia player (PMP), a solid state disk (SSD), or household appliances.

Figure 18:
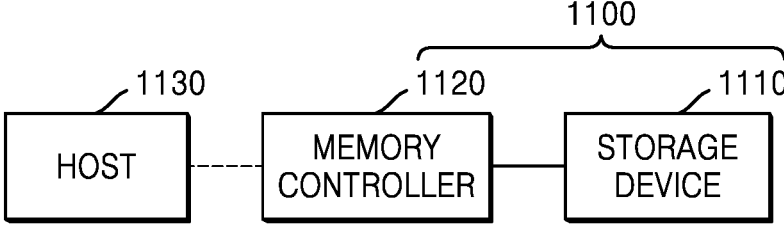
FIG. 18 is a memory card including a semiconductor device according to an embodiment of the present inventive concept.

FIG. 18 is a memory card 1100 including a semiconductor device according to an embodiment of the present inventive concept.

In an embodiment, the memory card 1100 includes a storage device 1110 and a memory controller 1120. The storage device 1110 may store data, in some embodiments, the storage device 1110 may have a non-volatile characteristic that maintains stored data even when power supply is interrupted. The storage device 1110 may include at least one of the semiconductor devices 100, 100a, 200, 300, and 400 according to embodiments of the present inventive concept.

The memory controller 1120 may read data stored in the storage device 1110 or store data of the storage device 1110 in response to a read/write request from the host 1130. The memory controller 1120 may include at least one of the semiconductor devices 100, 100a, 200, 300, and 400 according to embodiments of the present inventive concept.

While the present inventive concept has been particularly shown and described with reference to non-limiting embodiments thereof, it will be understood that various changes in form and details may be made therein without departing from the spirit and scope of the present inventive concept.

What is claimed is:

1. A semiconductor device comprising:
   a substrate having an active area and a non-active area;
   an extra pad layer disposed on the active area of the substrate;
   a first contact layer disposed in a contact hole defined inside the substrate from a surface of the extra pad layer;
   a first silicide layer disposed on both sidewalls of the first contact layer;
   a buried insulating layer buried in the contact hole at lateral sides of the first contact layer and the first silicide layer;
   a second silicide layer disposed on an upper surface and sidewalk of the extra pad layer; and
   a second contact layer on the buried insulating layer and the second silicide layer and in direct contact with the second silicide layer.

2. The semiconductor device of claim 1, wherein the first contact layer and the first silicide layer are first contact plugs in contact with the active area of the substrate.

3. The semiconductor device of claim 1, wherein the first contact layer comprises a protrusion part protruding from the upper surface of the extra pad layer.

4. The semiconductor device of claim 1, wherein the second silicide layer is disposed on an entirety of the upper surface and sidewalls of the extra pad layer.

5. The semiconductor device of claim 1, wherein the second silicide layer is disposed inside a portion of the upper surface of the extra pad layer, and is disposed on an entirety of the sidewalls of the extra pad layer.

6. The semiconductor device of claim 1, wherein the first silicide layer is composed of a same material as the second silicide layer.

7. The semiconductor device of claim 1, wherein:
   a recess hole exposing the second silicide layer is further defined on an upper surface of the buried insulating layer; and
   the second contact layer is buried in the recess hole.

8. The semiconductor device of claim 1, wherein the buried insulating layer comprises a liner layer in direct contact with the first silicide layer and the second silicide layer in the contact hole, and a liner buried layer filling the contact hole on the liner layer.

9. The semiconductor device of claim 1, wherein the second contact layer is a second contact plug contacting the active area of the substrate through the second silicide layer and the extra pad layer.

10. A semiconductor device comprising:
    a substrate having an active area and a non-active area;
    an extra pad layer disposed on the active area of the substrate;
    a first contact silicide layer disposed in a contact hole defined inside the substrate from a surface of the extra pad layer;
    a buried insulating layer buried in the contact hole on lateral sides of the first contact silicide layer;
    a second silicide layer disposed on an upper surface and sidewalls of the extra pad layer; and
    a second contact layer on the buried insulating layer and the second silicide layer and in direct contact with the second silicide layer.

11. The semiconductor device of claim 10, wherein:
    the first contact silicide layer is a first contact plug in contact with the active area of the substrate; and
    the second contact layer is a second contact plug contacting the active area of the substrate through the second silicide layer and the extra pad layer.

12. The semiconductor device of claim 10, wherein the first contact silicide layer is composed of a metal silicide layer.

13. The semiconductor device of claim 10, wherein the first contact silicide layer is composed of a same material as the second silicide layer.

14. The semiconductor device of claim 10, wherein the first contact silicide layer comprises a protrusion part protruding from the upper surface of the extra pad layer.

15. The semiconductor device of claim 10, wherein the second silicide layer is disposed inside a portion of the upper surface of the extra pad layer, and is disposed on an entirety of the sidewalls of the extra pad layer.

16. A semiconductor device comprising:
    a substrate having an active area and a non-active area;
    an extra pad layer disposed on the active area of the substrate;
    a pad isolation insulating layer disposed on the non-active area of the substrate and insulating the extra pad layer;
    a first contact layer disposed in a contact hole defined inside the substrate from a surface of the extra pad layer;
    a first silicide layer disposed on both sidewalls of the first contact layer;
    a first conductive layer disposed on the first contact layer and the first silicide layer;
    a buried insulating layer buried in the contact hole at lateral sides of the first contact layer and the first silicide layer;

a second silicide layer disposed on an upper surface and sidewalls of the extra pad layer;

a second contact layer on the buried insulating layer and the second silicide layer and in direct contact with the second silicide layer; and a second conductive layer disposed on the pad isolation insulating layer and insulated from the second contact layer.

17. The semiconductor device of claim 16, wherein the first contact layer extends in a direction perpendicular to a surface of the substrate and comprises a protrusion part protruding from the upper surface of the extra pad layer.

18. The semiconductor device of claim 16, wherein:

an upper width of the first contact layer is less than a width of the first conductive layer; and the upper width of the first silicide layer is equal to the width of the first conductive layer.

19. The semiconductor device of claim 16, wherein:

a buffer insulating layer is further disposed on the pad isolation insulating layer; and the second conductive layer is disposed on the buffer insulating layer.

20. The semiconductor device of claim 16, wherein:

the first conductive layer and the second conductive layer are a first conductive line and a second conductive line extending in a first direction on the substrate, respectively;

the first contact layer and the first silicide layer are disposed under the first conductive line; and the second contact layer is disposed between the first conductive line and the second conductive line.

\* \* \* \* \*